United States Patent
Sekiya et al.

(10) Patent No.: US 11,756,773 B2
(45) Date of Patent: *Sep. 12, 2023

(54) PLASMA PROCESSING APPARATUS

(71) Applicant: Canon Anelva Corporation, Kawasaki (JP)

(72) Inventors: Kazunari Sekiya, Hachioji (JP); Masaharu Tanabe, Fuchu (JP); Tadashi Inoue, Sagamihara (JP); Hiroshi Sasamoto, Tachikawa (JP); Tatsunori Sato, Hachioji (JP); Nobuaki Tsuchiya, Hamura (JP)

(73) Assignee: CANON ANELVA CORPORATION, Kawasaki (JP)

(*) Notice: Subject to any disclaimer, the term of this patent is extended or adjusted under 35 U.S.C. 154(b) by 105 days.

This patent is subject to a terminal disclaimer.

(21) Appl. No.: 17/452,640

(22) Filed: Oct. 28, 2021

(65) Prior Publication Data
US 2022/0051878 A1 Feb. 17, 2022

Related U.S. Application Data

(63) Continuation of application No. 16/720,154, filed on Dec. 19, 2019, now Pat. No. 11,569,070, which is a (Continued)

(30) Foreign Application Priority Data

Jun. 27, 2017 (WO) .................. PCT/JP2017/023603
Jun. 27, 2017 (WO) .................. PCT/JP2017/023611
Feb. 2, 2018 (JP) ................................ 2018-017554

(51) Int. Cl.
*H01J 37/32* (2006.01)
*H01J 37/18* (2006.01)

(52) U.S. Cl.
CPC ........ *H01J 37/32541* (2013.01); *H01J 37/18* (2013.01); *H01J 37/3255* (2013.01);
(Continued)

(58) Field of Classification Search
None
See application file for complete search history.

(56) References Cited

U.S. PATENT DOCUMENTS 4,014,779 A * 3/1977 Kuehnle ................. H01J 37/34
204/192.12
4,025,339 A * 5/1977 Kuehnle ................ G03G 5/082
430/84

(Continued)

FOREIGN PATENT DOCUMENTS

CN 1155748 A 7/1997
CN 1220931 A 6/1999
(Continued)

OTHER PUBLICATIONS

Written Decision on Registration issued in Korean Patent Application No. 10-2020-7001366, dated Sep. 23, 2022, with English Translation (6 pages).
(Continued)

*Primary Examiner* — Srinivas Sathiraju
(74) *Attorney, Agent, or Firm* — BUCHANAN INGERSOLL & ROONEY PC

(57) ABSTRACT

A plasma processing apparatus includes a balun having a first input terminal, a second input terminal, a first output terminal, and a second output terminal, a vacuum container, a first electrode electrically connected to the first output terminal, a second electrode electrically connected to the second output terminal, and a connection unit configured to electrically connect the vacuum container and ground, the connection unit including an inductor.

16 Claims, 15 Drawing Sheets

Related U.S. Application Data continuation of application No. PCT/JP2018/024150, filed on Jun. 26, 2018.

(52) U.S. Cl.
CPC ... *H01J 37/32449* (2013.01); *H01J 2237/327* (2013.01); *H01J 2237/334* (2013.01)

(56) References Cited

U.S. PATENT DOCUMENTS

| | | | | |
|---|---|---|---|---|
| 4,131,533 | A | 12/1978 | Bialko et al. | |
| 4,170,475 | A * | 10/1979 | Kuehnle | G03G 5/14 365/112 |
| 4,284,489 | A * | 8/1981 | Weber | H01J 37/32174 315/276 |
| 4,284,490 | A * | 8/1981 | Weber | H03H 7/383 204/192.12 |
| 4,584,079 | A | 4/1986 | Lee et al. | |
| 4,802,080 | A | 1/1989 | Bossi et al. | |
| 4,871,421 | A | 10/1989 | Ogle et al. | |
| 4,887,005 | A * | 12/1989 | Rough | H01J 37/32174 422/906 |
| 4,956,582 | A * | 9/1990 | Bourassa | H05H 1/46 315/111.21 |
| 5,077,499 | A * | 12/1991 | Oku | H03H 7/38 333/32 |
| 5,121,067 | A * | 6/1992 | Marsland | H01L 27/0605 257/E27.012 |
| 5,147,493 | A | 9/1992 | Nishimura et al. | |
| 5,169,509 | A | 12/1992 | Latz et al. | |
| 5,316,645 | A * | 5/1994 | Yamagami | C23C 14/3435 204/192.12 |
| 5,330,578 | A | 7/1994 | Sakama et al. | |
| 5,415,757 | A * | 5/1995 | Szcyrbowski | C23C 14/0036 204/192.12 |
| 5,464,499 | A | 11/1995 | Moslehi et al. | |
| 5,611,899 | A * | 3/1997 | Maass | H01J 37/34 204/298.14 |
| 5,698,082 | A * | 12/1997 | Teschner | H01J 37/3444 204/298.26 |
| 5,718,815 | A | 2/1998 | Szczyrbowski et al. | |
| 5,733,511 | A | 3/1998 | De | |
| 5,755,938 | A | 5/1998 | Fukui et al. | |
| 5,803,973 | A | 9/1998 | Szczyrbowski et al. | |
| 5,807,470 | A * | 9/1998 | Szczyrbowski | H01J 37/3444 204/192.12 |
| 5,830,331 | A | 11/1998 | Kim et al. | |
| 5,855,969 | A | 1/1999 | Robertson | |
| 5,932,116 | A | 8/1999 | Matsumoto et al. | |
| 5,989,999 | A * | 11/1999 | Levine | C23C 16/5096 438/653 |
| 5,990,016 | A | 11/1999 | Kim et al. | |
| 6,017,221 | A * | 1/2000 | Flamm | H01J 37/321 204/192.32 |
| 6,046,641 | A | 4/2000 | Chawla et al. | |
| 6,096,174 | A | 8/2000 | Teschner et al. | |
| 6,150,826 | A | 11/2000 | Hokodate et al. | |
| 6,239,404 | B1 | 5/2001 | Lea et al. | |
| 6,252,354 | B1 * | 6/2001 | Collins | H01J 37/32174 156/345.28 |
| 6,273,022 | B1 | 8/2001 | Pu et al. | |
| 6,422,172 | B1 * | 7/2002 | Tanaka | H01J 37/32082 204/298.37 |
| 6,517,912 | B1 * | 2/2003 | Morfill | H05H 3/04 977/773 |
| 6,568,346 | B2 | 5/2003 | Pu et al. | |
| 6,703,080 | B2 | 3/2004 | Reyzelman et al. | |
| 6,818,103 | B1 * | 11/2004 | Scholl | C23C 14/3464 204/192.12 |
| 6,825,618 | B2 | 11/2004 | Pu et al. | |
| 6,876,205 | B2 | 4/2005 | Walde et al. | |
| 6,885,154 | B2 | 4/2005 | Uchida et al. | |
| 6,913,703 | B2 | 7/2005 | Strang et al. | |
| 7,032,536 | B2 | 4/2006 | Fukuoka et al. | |
| 7,298,091 | B2 * | 11/2007 | Pickard | H03H 7/38 156/345.28 |
| 7,445,690 | B2 | 11/2008 | Kasai et al. | |
| 7,586,210 | B2 | 9/2009 | Wiedemuth et al. | |
| 7,670,455 | B2 | 3/2010 | Keller et al. | |
| 7,777,567 | B2 | 8/2010 | Polizzo | |
| 8,033,246 | B2 * | 10/2011 | Wiedemuth | H01J 37/32045 156/345.43 |
| 8,293,068 | B2 | 10/2012 | Koshimizu et al. | |
| 8,450,635 | B2 | 5/2013 | Dhindsa et al. | |
| 8,647,585 | B2 * | 2/2014 | Hancock | A61N 5/022 422/186.04 |
| 8,932,430 | B2 | 1/2015 | Srivastava et al. | |
| 8,992,723 | B2 | 3/2015 | Sorensen et al. | |
| 9,039,864 | B2 | 5/2015 | Baek et al. | |
| 9,121,786 | B2 | 9/2015 | Tie | |
| 9,147,555 | B2 | 9/2015 | Richter | |
| 9,245,776 | B2 * | 1/2016 | Himori | H01L 21/67069 |
| 9,401,265 | B2 | 7/2016 | Michel et al. | |
| 9,455,126 | B2 * | 9/2016 | Valcore, Jr. | H01J 37/32082 |
| 9,564,360 | B2 | 2/2017 | Akasaka et al. | |
| 9,607,810 | B2 * | 3/2017 | Valcore, Jr. | H01J 37/32981 |
| 9,620,337 | B2 * | 4/2017 | Valcore, Jr. | G01R 31/40 |
| 9,640,367 | B2 | 5/2017 | Keller et al. | |
| 9,675,716 | B2 * | 6/2017 | Hancock | A61N 5/022 |
| 9,779,196 | B2 * | 10/2017 | Valcore, Jr. | G06F 30/36 |
| 9,875,881 | B2 | 1/2018 | Nagami et al. | |
| 10,081,869 | B2 | 9/2018 | Augustyniak et al. | |
| 10,083,817 | B1 | 9/2018 | Godyak | |
| 10,157,729 | B2 * | 12/2018 | Valcore, Jr. | H01J 37/32082 |
| RE47,276 | E | 3/2019 | Benjamin | |
| 10,224,463 | B2 | 3/2019 | Daigo | |
| 10,231,321 | B2 * | 3/2019 | Valcore, Jr. | H05H 1/46 |
| 10,354,838 | B1 * | 7/2019 | Mopidevi | H01L 21/6831 |
| 10,410,889 | B2 | 9/2019 | Sadjadi et al. | |
| 10,544,505 | B2 | 1/2020 | Yang et al. | |
| 10,553,406 | B2 | 2/2020 | Chang et al. | |
| 10,685,810 | B2 * | 6/2020 | Mopidevi | H01J 37/3211 |
| 10,879,043 | B2 * | 12/2020 | Selmo | H01J 37/32174 |
| 11,013,075 | B2 | 5/2021 | Lester et al. | |
| 11,114,287 | B2 | 9/2021 | Harris et al. | |
| 11,170,991 | B2 | 11/2021 | Sakane | |
| 11,315,765 | B2 | 4/2022 | Yamawaku et al. | |
| 11,569,070 | B2 * | 1/2023 | Sekiya | H01J 37/32541 |
| 2001/0054383 | A1 | 12/2001 | Pu et al. | |
| 2002/0022836 | A1 | 2/2002 | Goble et al. | |
| 2003/0087044 | A1 | 5/2003 | Willms et al. | |
| 2003/0215373 | A1 | 11/2003 | Reyzelman et al. | |
| 2004/0222184 | A1 | 11/2004 | Hayami et al. | |
| 2004/0262156 | A1 | 12/2004 | Seymour et al. | |
| 2005/0136604 | A1 | 6/2005 | Al-bayati et al. | |
| 2005/0138577 | A1 | 6/2005 | Adamian | |
| 2005/0160987 | A1 | 7/2005 | Kasai et al. | |
| 2006/0032738 | A1 | 2/2006 | Wiedemuth | |
| 2008/0050537 | A1 | 2/2008 | Godyak | |
| 2008/0258411 | A1 * | 10/2008 | Miura | H01L 21/67109 279/128 |
| 2008/0308041 | A1 * | 12/2008 | Koshiishi | H01J 37/32165 118/715 |
| 2009/0041640 | A1 | 2/2009 | Kasai et al. | |
| 2009/0075597 | A1 | 3/2009 | Degani et al. | |
| 2009/0085597 | A1 | 4/2009 | Burns et al. | |
| 2009/0102385 | A1 | 4/2009 | Wi | |
| 2009/0117707 | A1 | 5/2009 | Shimomura et al. | |
| 2009/0242135 | A1 | 10/2009 | Koshimizu et al. | |
| 2010/0252199 | A1 | 10/2010 | Marakhtanov et al. | |
| 2010/0294433 | A1 | 11/2010 | Jianhui | |
| 2011/0300694 | A1 | 12/2011 | Matsumoto et al. | |
| 2013/0017315 | A1 | 1/2013 | Lai et al. | |
| 2013/0105082 | A1 | 5/2013 | Melikyan et al. | |
| 2013/0337657 | A1 * | 12/2013 | Savas | H01L 21/0217 118/723 MP |
| 2014/0373783 | A1 | 12/2014 | Sawada et al. | |
| 2015/0054405 | A1 | 2/2015 | Nettesheim | |
| 2015/0165752 | A1 | 6/2015 | Plach et al. | |
| 2015/0170882 | A1 | 6/2015 | Yamawaku et al. | |
| 2015/0255258 | A1 | 9/2015 | Nozawa et al. | |
| 2016/0240351 | A1 | 8/2016 | Burgess et al. | |

(56) References Cited

U.S. PATENT DOCUMENTS

| | | | |
|---|---|---|---|
| 2016/0289837 A1* | 10/2016 | Savas | C23C 16/509 |
| 2016/0307743 A1 | 10/2016 | Brown et al. | |
| 2016/0336084 A1 | 11/2016 | Laguardia et al. | |
| 2017/0018401 A1* | 1/2017 | Rudolph | H01J 37/3244 |
| 2017/0084432 A1* | 3/2017 | Valcore, Jr. | H01J 37/32146 |
| 2017/0213734 A9 | 7/2017 | Marakhtanov et al. | |
| 2017/0232122 A1 | 8/2017 | Hancock | |
| 2018/0130640 A1* | 5/2018 | Gregor | C23C 16/4404 |
| 2018/0202046 A1* | 7/2018 | Savas | C23C 16/345 |
| 2018/0240647 A1* | 8/2018 | McChesney | H01J 37/32183 |
| 2018/0269035 A1* | 9/2018 | Selmo | H01J 37/32174 |
| 2018/0318459 A1 | 11/2018 | Hancock et al. | |
| 2019/0221405 A1 | 7/2019 | Yamawaku et al. | |
| 2020/0126763 A1* | 4/2020 | Sekiya | H01L 21/3065 |
| 2020/0126764 A1* | 4/2020 | Inoue | H01J 37/32715 |
| 2020/0126766 A1* | 4/2020 | Sekiya | C23C 14/34 |
| 2020/0126767 A1* | 4/2020 | Takeda | H01J 37/18 |
| 2020/0126768 A1* | 4/2020 | Inoue | H01J 37/18 |
| 2020/0161096 A1 | 5/2020 | Chang et al. | |
| 2021/0005429 A1 | 1/2021 | Tanabe et al. | |
| 2021/0118649 A1 | 4/2021 | Huh et al. | |
| 2022/0051878 A1* | 2/2022 | Sekiya | H01J 37/32091 |

FOREIGN PATENT DOCUMENTS

| | | |
|---|---|---|
| CN | 1390436 A | 1/2003 |
| CN | 2907173 Y | 5/2007 |
| CN | 101425456 A | 5/2009 |
| CN | 101478857 A | 7/2009 |
| CN | 101546697 A | 9/2009 |
| CN | 102479657 A | 5/2012 |
| CN | 103091042 A | 5/2013 |
| CN | 103094042 A | 5/2013 |
| CN | 104024471 A | 9/2014 |
| CN | 105887050 A | 8/2016 |
| CN | 106024568 A | 10/2016 |
| DE | 19713637 A1 | 10/1998 |
| EP | 1748687 A1 | 1/2007 |
| JP | S53141937 U | 11/1978 |
| JP | S55035465 B2 | 9/1980 |
| JP | S62133065 A | 6/1987 |
| JP | H02501608 A | 5/1990 |
| JP | H02156080 A | 6/1990 |
| JP | H02156081 A | 6/1990 |
| JP | H02156082 A | 6/1990 |
| JP | H02156083 A | 6/1990 |
| JP | H04-317325 A | 11/1992 |
| JP | H10-261621 A | 9/1998 |
| JP | H11307299 A | 11/1999 |
| JP | 2000-030896 A | 1/2000 |
| JP | 2000195851 A | 7/2000 |
| JP | 2000-294543 A | 10/2000 |
| JP | 2002-141292 A | 5/2001 |
| JP | 2001122690 A | 5/2001 |
| JP | 2001-181848 A | 7/2001 |
| JP | 2001-518230 A | 10/2001 |
| JP | 2002004040 A | 1/2002 |
| JP | 2002118101 | 4/2002 |
| JP | 2003-512526 A | 4/2003 |
| JP | 2003155556 A | 5/2003 |
| JP | 2005026540 A | 1/2005 |
| JP | 2005130376 A | 5/2005 |
| JP | 2005303257 A | 10/2005 |
| JP | 2006336084 A | 12/2006 |
| JP | 2008294465 A | 12/2008 |
| JP | 2008300322 A | 12/2008 |
| JP | 2009021634 A | 1/2009 |
| JP | 2009105030 A | 5/2009 |
| JP | 2009302566 A | 12/2009 |
| JP | 2010045664 A | 2/2010 |
| JP | 2010109157 A | 5/2010 |
| JP | 2010255061 A | 11/2010 |
| JP | 2011-138907 A | 7/2011 |
| JP | 2011144450 A | 7/2011 |
| JP | 4909523 B2 | 4/2012 |
| JP | 2012142332 A | 7/2012 |
| JP | 2012174682 A | 9/2012 |
| JP | 2013139642 A | 7/2013 |
| JP | 2014049541 A | 3/2014 |
| JP | 2015-115216 A | 6/2015 |
| JP | 5824072 B2 | 10/2015 |
| JP | 2016225376 A | 12/2016 |
| JP | 2017211144 A | 11/2017 |
| JP | 6280677 B1 | 2/2018 |
| JP | 6309683 B1 | 4/2018 |
| KR | 10-2014-0135202 A | 11/2014 |
| TW | 200741794 A | 11/2007 |
| TW | 201311059 A | 3/2013 |
| TW | 201423827 A | 6/2014 |
| TW | I492294 B | 7/2015 |
| TW | 201532220 A | 8/2015 |
| TW | 201643932 A | 12/2016 |
| TW | I560767 B | 12/2016 |
| TW | I575107 B | 3/2017 |
| TW | I601309 B | 10/2017 |
| WO | 8902695 A1 | 3/1989 |
| WO | 01/29278 A1 | 4/2001 |
| WO | 0137619 A1 | 5/2001 |
| WO | 2010024128 A1 | 3/2010 |
| WO | 2010041679 A1 | 4/2010 |
| WO | 2012/095961 A1 | 7/2012 |
| WO | 2019/004191 A1 | 1/2019 |

OTHER PUBLICATIONS

Extended European Search Report issued in European Patent Application No. 18 92 4031, dated Feb. 15, 2022, (9 pages). European Patent Application No. 18 92 4031 corresponds to U.S. Appl. No. 17/023,675.

Office Action issued in U.S. Appl. No. 16/720,173, dated May 12, 2022 (27 pages).

Office Action issued in U.S. Appl. No. 16/720,087, dated Apr. 7, 2022, (84 pages).

Notification of the First Office Action issued in Chinese Patent Application No. 201880094963.9, dated Oct. 10, 2022, with English Translation (33 pages).

First Office Action dated Jun. 2, 2021, by the Chinese Patent Office in corresponding Chinese Patent Application No. 201880042465, and English Translation of the Office Action. (23 pages).

First Office Action dated Jun. 2, 2021, by the Chinese Patent Office in corresponding Chinese Patent Application No. 201880042477.2, and English Translation of the Office Action. (23 pages).

First Office Action dated Jun. 2, 2021, by the Chinese Patent Office in corresponding Chinese Patent Application No. 201780092518.4, and English Translation of the Office Action. (21 pages).

First Office Action dated Jun. 2, 2021, by the Chinese Patent Office in corresponding Chinese Patent Application No. 201780092519.9, and English Translation of the Office Action. (23 pages).

First Office Action dated Jun. 3, 2021, by the Chinese Patent Office in corresponding Chinese Patent Application No. 201880042506.5, and English Translation of the Office Action. (23 pages).

Office Action (Notice of Preliminary Rejection) dated Apr. 19, 2021, by the Korean Patent Office in corresponding Korean Patent Application No. 10-2020-7001366, and an English Translation of the Office Action. (14 pages).

Office Action (Notice of Preliminary Rejection) dated Apr. 26, 2021, by the Korean Patent Office in corresponding Korean Patent Application No. 10-2020-7001366, and an English Translation of the Office Action. (9 pages).

Office Action (Grant of Patent) dated Apr. 27, 2021, by the Korean Patent Office in corresponding Korean Patent Application No. 10-2020-7001397, and an English Translation of the Office Action. (4 pages).

Office Action Summary dated Mar. 15, 2021, by the U.S. Patent and Trademark Office in corresponding U.S. Appl. No. 16/720,154. (19 pages).

Office Action Summary dated Jan. 6, 2021, by the U.S. Patent and Trademark Office in corresponding U.S. Appl. No. 16/720,154. (27 pages).

(56) References Cited

OTHER PUBLICATIONS

Office Action dated Sep. 22, 2021, by the U.S. Patent and Trademark Office in corresponding U.S. Appl. No. 16/720,262.
Office Action dated Aug. 19, 2021, by the U.S. Patent and Trademark Office in corresponding U.S. Appl. No. 17/023,675.
Co-pending U.S. Appl. No. 17/023,675, filed Sep. 17, 2020.
Notice of Allowance dated Sep. 20, 2021, by the U.S. Patent and Trademark Office in U.S. Appl. No. 16/720,154.
Supplemental European Search Report issued in corresponding Patent Application No. 18823378.7, dated May 25, 2020. (7 pages).
Supplemental European Search Report issued in corresponding European Patnt Application No. 18824433, dated Apr. 30, 2020. (8 pages).
International Search Report (PCT/ISA/210) and translation and Written Opinion (PCT/ISA/237) dated Sep. 11, 2018, by the Japanese Patent Office as the International Searching Authority for International Application No. PCT/JP2018/024150.
International Search Report (PCT/ISA/210) and Written Opinion (PCT/ISA/237) dated Sep. 4, 2018, by the Japanese Patent Office as the International Searching Authority for International Application No. PCT/JP2018/024154.
International Search Report (PCT/ISA/210) and Written Opinion (PCT/ISA/237) dated Sep. 19, 2017, by the Japanese Patent Office as the International Searching Authority for International Application No. PCT/JP2017/023611.
International Search Report (PCT/ISA/210) and Written Opinion (PCT/ISA/237) dated Sep. 19, 2017, by the Japanese Patent Office as the International Searching Authority for International Application No. PCT/JP2018/023603.
International Search Report (PCT/ISA/210) and Written Opinion (PCT/ISA/237) dated Mar. 12, 2019, by the Japanese Patent Office as the International Searching Authority for International Application No. PCT/JP2018/047319.
Final Office Action issued in U.S. Appl. No. 16/720,087, dated Oct. 25, 2022 (36 pages).
Office Action issued in U.S. Appl. No. 16/720,156, dated Apr. 1, 2022, (19 pages).
Notice of Reasons for Refusal issued in corresponding Japanese Patent Application No. 2019-012426, dated Aug. 15, 2022, with English Translation (8 pages).
Notice of Reasons for Refusal issued in corresponding Japanese Patent Application No. 2019-012419, dated Aug. 15, 2022, with English Translation (14 pages).
International Preliminary Report on Patentability (PCT/IPEA/409) received for PCT Patent Application No. PCT/JP2018/024145, dated Jul. 23, 2019, 10 pages of English Translation.
Non Final Office Action received for U.S. Appl. No. 16/720,154, dated May 26, 2022, 16 pages.
Non-Final Office Action received for U.S. Appl. No. 16/720,156, dated Oct. 25, 2021, 16 pages.
Notice of Allowance received for U.S. Appl. No. 16/720,262, dated May 27, 2022, 8 pages.
Notice of Allowance received for U.S. Appl. No. 17/023,675, dated May 26, 2022, 12 pages.

\* cited by examiner

FIG. 7

|  | PRESENCE OF INDUCTOR | ABSENCE OF INDUCTOR |
|---|---|---|
| I1 | 9.2 | 8.3 |
| I2' | 8.6 | 5.8 |
| I3 | 0.06 | 2.1 |
| ISO | -43.1 | -8.8 |

PLASMA PROCESSING APPARATUS

CROSS-REFERENCE TO RELATED APPLICATION(S)

This application is a continuation of U.S. patent application Ser. No. 16/720,154, filed Dec. 19, 2019, which is a continuation of International Patent Application No. PCT/JP2018/024150 filed Jun. 26, 2018, which claims priority to and the benefit of International Patent Application No. PCT/JP2017/023611 filed Jun. 27, 2017, International Patent Application No. PCT/JP2017/023603 filed Jun. 27, 2017, Japanese patent application No. 2018-017554 filed Feb. 2, 2018, the entire disclosures of which are incorporated herein by reference.

TECHNICAL FIELD

The present invention relates to a plasma processing apparatus.

BACKGROUND ART

There is provided a plasma processing apparatus that generates plasma by applying a high frequency between two electrodes and processes a substrate by the plasma. Such plasma processing apparatus can operate as an etching apparatus or a sputtering apparatus by the bias and/or the area ratio of the two electrodes. The plasma processing apparatus configured as a sputtering apparatus includes the first electrode that holds a target and the second electrode that holds a substrate. A high frequency is applied between the first and second electrodes, and plasma is generated between the first and second electrodes (between the target and the substrate). When plasma is generated, a self-bias voltage is generated on the surface of the target. This causes ions to collide against the target, and the particles of a material constituting the target are discharged from the target.

PTL 1 describes a plasma surface treatment apparatus including a balanced/unbalanced converter. This plasma surface treatment apparatus includes a high-frequency power source, a power amplifier, an impedance matching device, a coaxial cable, a vacuum container, a discharge gas mixing box, an ungrounded electrode, a grounded electrode, and a transformer type balanced/unbalanced converter. The discharge gas mixing box, the ungrounded electrode, the grounded electrode, and the transformer type balanced/unbalanced converter are arranged in the vacuum container. The ungrounded electrode is installed in the vacuum container via an insulator support material and the discharge gas mixing box. The grounded electrode supports a substrate. Furthermore, the grounded electrode is electrically connected to the vacuum container. An output from the high-frequency power supply is supplied between the ungrounded electrode and the grounded electrode via the power amplifier, the impedance matching device, the coaxial cable, and the transformer type balanced/unbalanced converter. According to PTL 1, an in-phase current Ix flowing via the member of the vacuum container connected to the grounded electrode is blocked by the transformer type balanced/unbalanced converter.

Although no examination is made in PTL 1, according to an examination by the present inventor, the magnitude of the in-phase current Ix is decided by the ratio between a reactance X of the winding of the balanced/unbalanced converter (to be referred to as the balun hereinafter) and an impedance (resistance component) Rp of the load on the output side of the balanced/unbalanced converter, that is, X/Rp. As X/Rp is higher, the isolation performance between ground and the output side (balanced circuit side) of the balanced/unbalanced converter is improved, and the in-phase current Ix becomes smaller.

According to an examination by the present inventor, if a condition under which a plasma density becomes low is set in the plasma processing apparatus, for example, if a pressure in the vacuum container is low, if the distance between the electrodes is long, if the area of the electrode is small, or if the frequency of a high frequency generated by a high-frequency source is low, the impedance Rp of the load when viewing the electrode side from the balun is high. Consequently, if the impedance Rp is high, it is necessary to increase the reactance X of the winding of the balun in order to increase X/Rp to make the in-phase current Ix small. To achieve this, it is necessary to increase the number of turns of the winding or increase the size of a toroidal core. However, this increases the size of the balun.

CITATION LIST

Patent Literature

PTL 1: Japanese Patent Laid-Open No. 2009-302566

SUMMARY OF INVENTION

The present invention has been made based on the above problem recognition, and provides a technique advantageous in reducing an in-phase current without increasing the size of a balun.

According to one aspect of the present invention, there is provided a plasma processing apparatus comprising a balun including a first input terminal, a second input terminal, a first output terminal, and a second output terminal, a vacuum container, a first electrode electrically connected to the first output terminal, a second electrode electrically connected to the second output terminal, and a connection unit configured to electrically connect the vacuum container and ground, the connection unit including an inductor.

BRIEF DESCRIPTION OF DRAWINGS

FIG. 7 is a table exemplifying improvement in isolation performance by the connection unit (inductor);

DESCRIPTION OF EMBODIMENTS

The present invention will be described below with reference to the accompanying drawings by way of exemplary embodiments.

Figure 1:
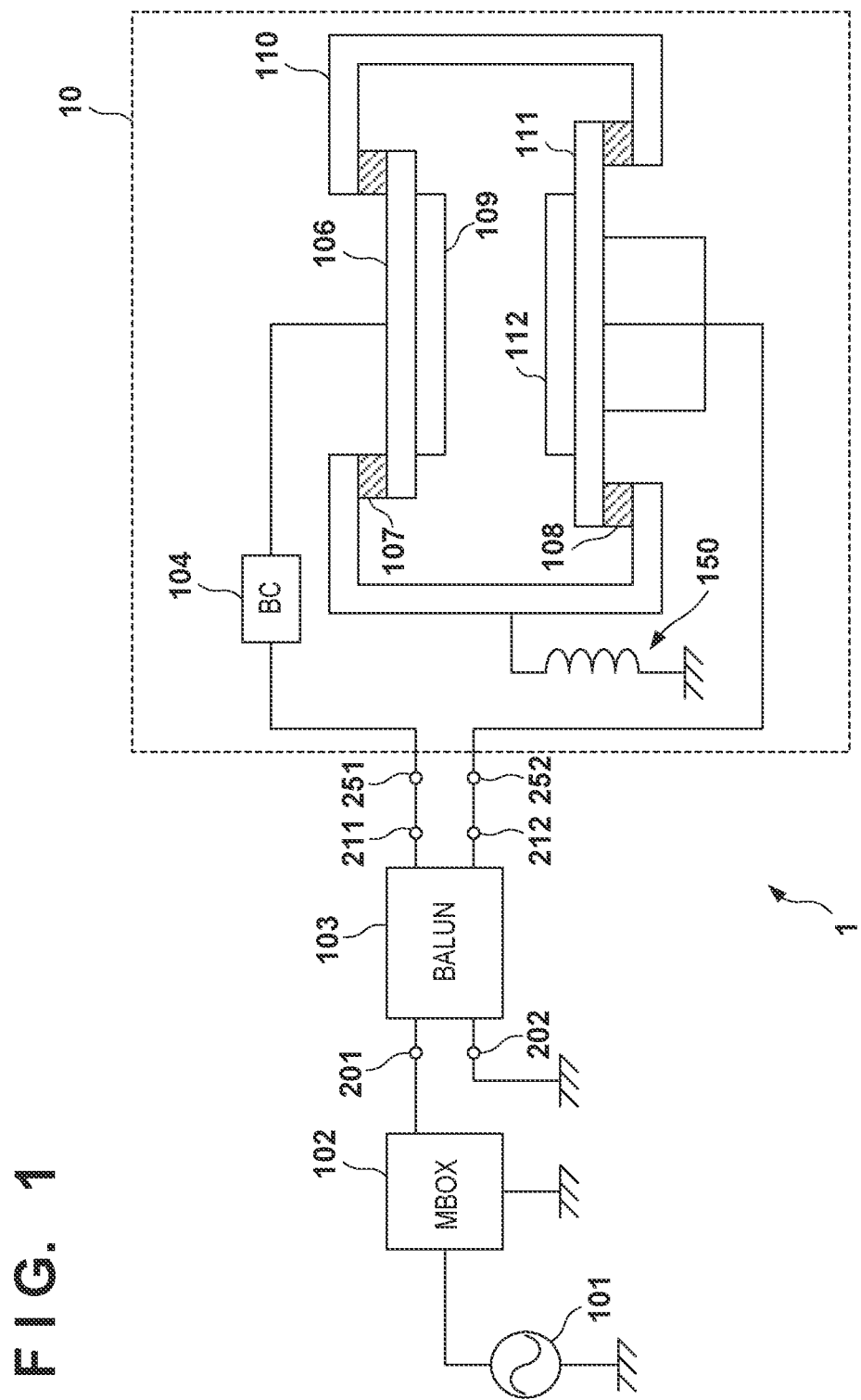
FIG. 1 is a circuit diagram schematically showing the arrangement of a plasma processing apparatus according to the first embodiment of the present invention.

FIG. 1 schematically shows the arrangement of a plasma processing apparatus 1 according to the first embodiment of the present invention. The plasma processing apparatus according to the first embodiment can operate as a sputtering apparatus that forms a film on a substrate 112 by sputtering. The plasma processing apparatus 1 includes a balun (balanced/unbalanced converter) 103, a vacuum container 110, a first electrode 106, a second electrode 111, and a connection unit 150. Alternatively, it may be understood that the plasma processing apparatus 1 includes the balun 103 and a main body 10, and the main body 10 includes the vacuum container 110, the first electrode 106, the second electrode 111, and the connection unit 150. The main body 10 includes a first terminal 251 and a second terminal 252. The first electrode 106 may be arranged to separate a vacuum space and an external space (that is, to form part of a vacuum partition) in cooperation with the vacuum container 110, or may be arranged in the vacuum container 110. The second electrode 111 may be arranged to separate a vacuum space and an external space (that is, to form part of a vacuum partition) in cooperation with the vacuum container 110, or may be arranged in the vacuum container 110.

At least a portion of the vacuum container 110 can be formed by a conductor. The vacuum container 110 can include a portion formed by a conductor. The connection unit 150 electrically connects the vacuum container 110 (the conductor forming at least a portion of the vacuum container 110) and ground. The connection unit 150 includes an inductor to improve the isolation performance of a balanced circuit with respect to ground, in other words, the isolation performance with respect to ground on the output side (the side of the first output terminal 211 and the second output terminal 212) of the balun 103. The balun 103 includes a first input terminal 201, a second input terminal 202, a first output terminal 211, and a second output terminal 212.

In the first embodiment, the first electrode 106 serves as a cathode, and holds a target 109. The target 109 can be, for example, an insulator material or a conductor material. Furthermore, in the first embodiment, the second electrode 111 serves as an anode, and holds a substrate 112. The plasma processing apparatus 1 according to the first embodiment can operate as a sputtering apparatus that forms a film on the substrate 112 by sputtering the target 109. The first electrode 106 is electrically connected to the first output terminal 211, and the second electrode 111 is electrically connected to the second output terminal 212. When the first electrode 106 and the first balanced terminal 211 are electrically connected to each other, this indicates that a current path is formed between the first electrode 106 and the first output terminal 211 so that a current flows between the first electrode 106 and the first output terminal 211. Similarly, in this specification, when a and b are electrically connected, this indicates that a current path is formed between a and b so that a current flows between a and b.

The above arrangement can be understood as an arrangement in which the first electrode 106 is electrically connected to the first terminal 251, the second electrode 111 is electrically connected to the second terminal 252, the first terminal 251 is electrically connected to the first output terminal 211, and the second terminal 252 is electrically connected to the second output terminal 212.

In the first embodiment, the first electrode 106 and the first output terminal 211 (first terminal 251) are electrically connected via a blocking capacitor 104. The blocking capacitor 104 blocks a DC current between the first output terminal 211 and the first electrode 106 (or between the first output terminal 211 and the second output terminal 212). This may generate a self-bias voltage in the first electrode 106. Instead of providing the blocking capacitor 104, an impedance matching circuit 102 (to be described later) may be configured to block a DC current flowing between the first input terminal 201 and the second input terminal 202. If the target 109 is made of an insulating material, the blocking capacitor 104 need not be provided.

The first electrode 106 and the second electrode 111 are insulated from the vacuum container 110 (the conductor forming at least a portion of the vacuum container 110). For example, the first electrode 106 can be supported by the vacuum container 110 via an insulator 107, and the second electrode 111 can be supported by the vacuum container 110 via an insulator 108.

The plasma processing apparatus 1 can further include a high-frequency power supply 101, and the impedance matching circuit 102 arranged between the high-frequency power supply 101 and the balun 103. The high-frequency power supply 101 supplies a high frequency (high-frequency current, high-frequency voltage, and high-frequency power) between the first input terminal 201 and the second input terminal 202 of the balun 103 via the impedance matching circuit 102. In other words, the high-frequency power supply 101 supplies a high frequency (high-frequency current, high-frequency voltage, and high-frequency power) between the first electrode 106 and the second electrode 111 via the impedance matching circuit 102, the balun 103, and the blocking capacitor 104. Alternatively, the high-frequency power supply 101 can be understood to supply a high frequency between the first terminal 251 and the second terminal 252 of the main body 10 via the impedance matching circuit 102 and the balun 103.

A gas (for example, Ar, Kr, or Xe gas) is supplied to the internal space of the vacuum container 110 through a gas supply unit (not shown) provided in the vacuum container 110. In addition, the high-frequency power supply 101 supplies a high frequency between the first electrode 106 and the second electrode 111 via the impedance matching circuit 102, the balun 103, and the blocking capacitor 104. This generates plasma between the first electrode 106 and the second electrode 111, and generates a self-bias voltage on the surface of the target 109 to cause ions in the plasma to collide against the surface of the target 109, thereby discharging, from the target 109, the particles of a material constituting the target 109. Then, the particles form a film on the substrate 112.

Figure 2A:
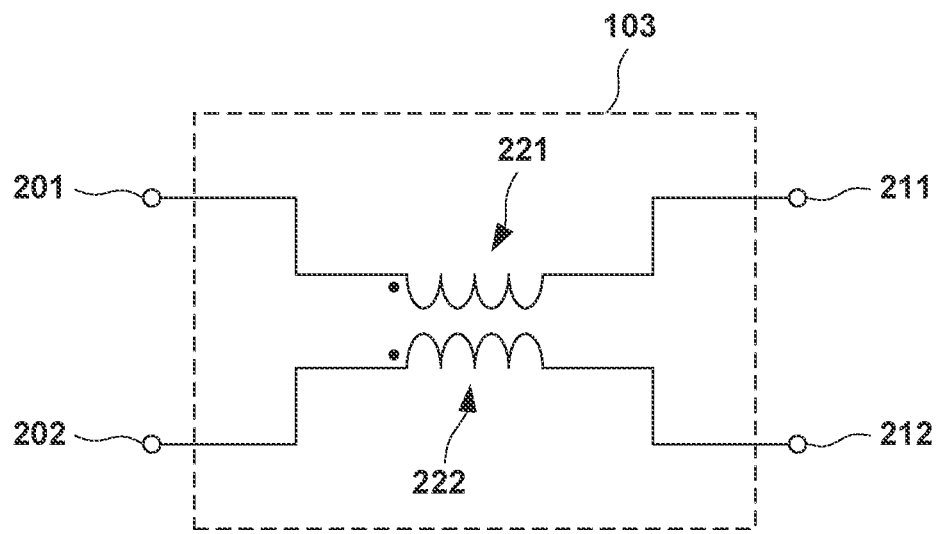
FIG. 2A is a circuit diagram showing an example of the arrangement of a balun.

FIG. 2A shows an example of the arrangement of the balun 103. The balun 103 shown in FIG. 2A includes a first coil 221 that connects the first input terminal 201 and the first output terminal 211, and a second coil 222 that connects the second input terminal 202 and the second output terminal 212. The first coil 221 and the second coil 222 are coils having the same number of turns, and share an iron core.

Figure 2B:
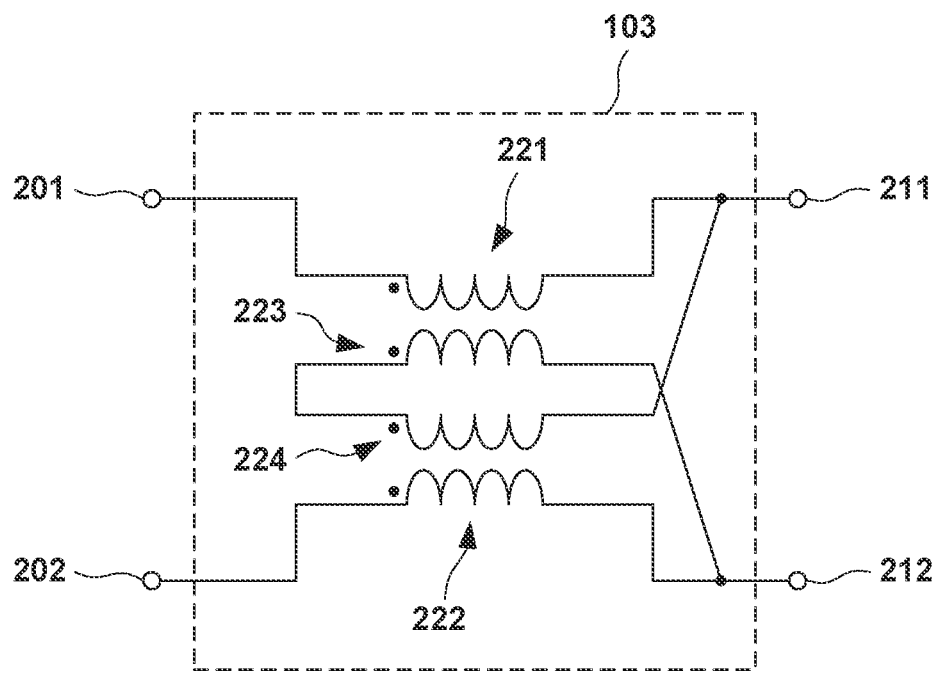
FIG. 2B is a circuit diagram showing another example of the arrangement of the balun.

FIG. 2B shows another example of the arrangement of the balun 103. The balun 103 shown in FIG. 2B includes a first coil 221 that connects the first input terminal 201 and the first output terminal 211, and a second coil 222 that connects the second input terminal 202 and the second output terminal 212. The balun 103 shown in FIG. 2B can include a third coil 223 that is magnetically coupled to the first coil 221 by sharing an iron core with the first coil 221, and a fourth coil 224 that is magnetically coupled to the second coil 222 by sharing an iron core with the second coil 222. The first output terminal 211 and the second output terminal 212 are connected by a series circuit formed from the third coil 223 and the fourth coil 224. The first coil 221, the second coil 222, the third coil 223, and the fourth coil 224 are coils having the same number of turns, and share an iron core.

The functions of the balun 103 and the connection unit 150 will be described with reference to FIGS. 3A, 3B, 4A, 4B, 5A, 5B, 6A, 6B, and 7. Let I1 be a current flowing through the first input terminal 201, I2 be a current flowing through the first output terminal 211, I2' be a current flowing through the second input terminal 202, and I3 be a current, of the current I2, flowing to ground. The currents I1, I2, I2', and I1 are high-frequency currents. When I3=0, the isolation performance with respect to ground on the output side of the balun 103 is highest. When I3=I2, that is, all the current I2 flowing through the first output terminal 211 flows to ground, the isolation performance with respect to ground on the output side of the balun 103 is lowest. An index ISO representing the degree of the isolation performance is given by an equation below. Under this definition, as the absolute value of the index ISO is larger, the isolation performance is higher.

$$ISO[dB] = 20 \log(I3/I2')$$

In FIGS. 3A, 3B, 4A, 4B, 5A, 5B, 6A, and 6B, Rp–jXp (denoted by reference numeral 160) represents an impedance (including the reactance of the blocking capacitor 104) when viewing the side of the first electrode 106 and the second electrode 111 (the side of the main body 10) from the side of the first output terminal 211 and the second output terminal 212 in a state in which plasma is generated in the internal space of the vacuum container 110. Rp represents a resistance component, and –Xp represents a reactance component. Furthermore, in FIGS. 3A, 3B, 4A, 4B, 5A, 5B, 6A, and 6B, X represents the reactance component (inductance component) of the impedance of the first coil 221 of the balun 103.

ISO indicating the isolation performance has a correlation with X/Rp. More specifically, as X/Rp is higher, the absolute value of ISO is larger. If the impedance (resistance component) of the plasma is high, Rp is high. Therefore, to increase X/Rp, it is necessary to increase the reactance X of the first coil 221 of the balun 103. As a method to do this, there are provided a method of increasing the number of turns of the first coil 221 and a method of increasing the size of the toroidal core (iron core) of the balun 103. However, in either method, the size of the balun 103 can be increased.

Figure 3A:
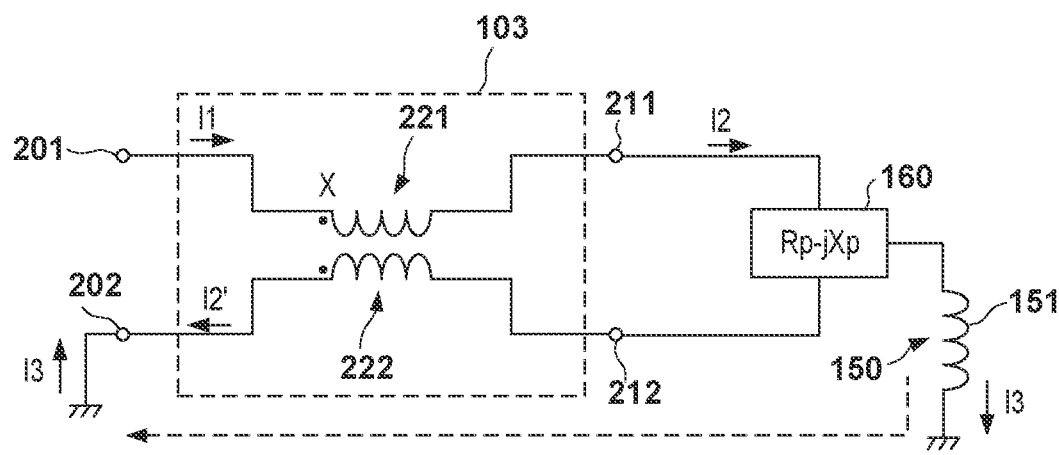
FIG. 3A is a circuit diagram for explaining the functions of the balun and a connection unit.

In the first embodiment, to improve the isolation performance without increasing the size of the balun 103, the connection unit 150 that electrically connects the vacuum container 110 (the conductor forming at least a portion of the vacuum container 110) and ground can be provided. The connection unit 150 includes an inductor 151, and the inductor 151 suppresses an AC current, thereby reducing the in-phase current I3. FIG. 3A shows the first arrangement example of the connection unit 150.

Figure 5A:
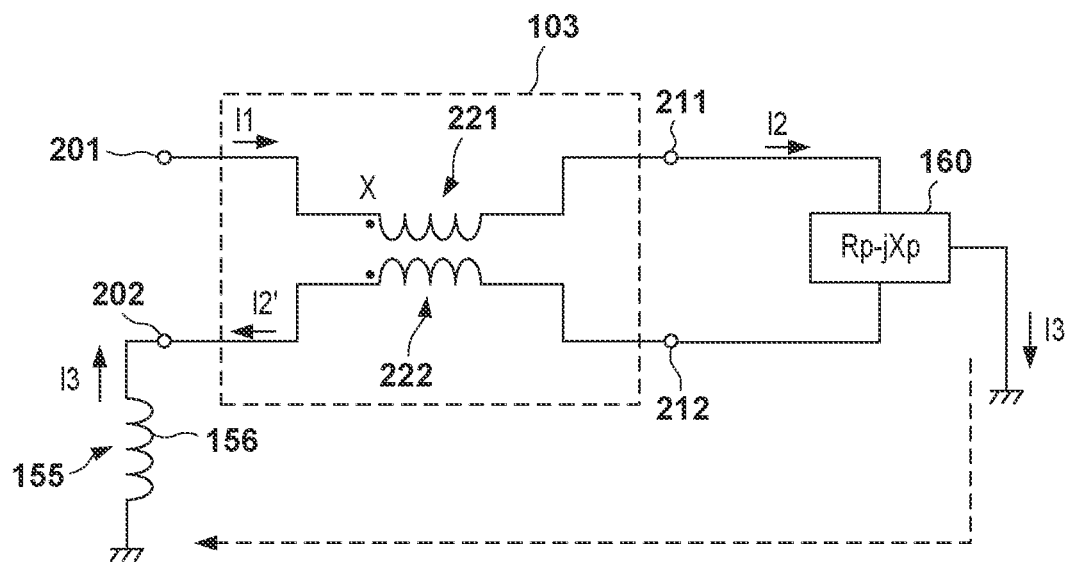
FIG. 5A is a circuit diagram for explaining the functions of the balun and the connection unit.
Figure 5B:
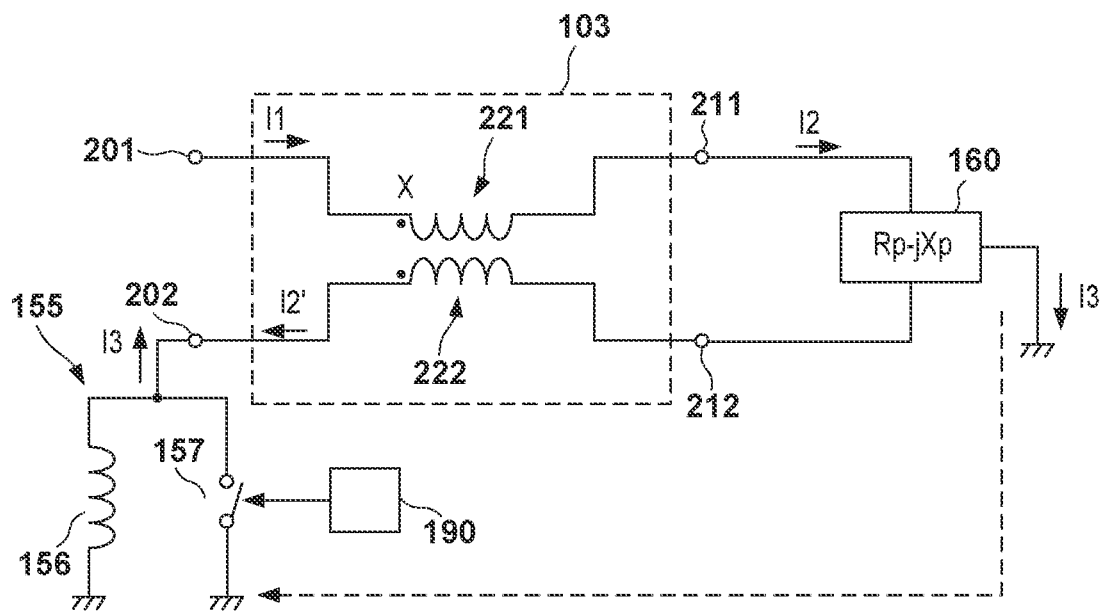
FIG. 5B is a circuit diagram for explaining the functions of the balun and the connection unit.

FIG. 7 exemplifies a difference in isolation performance caused by the presence/absence of the inductor. In FIGS. 5A and 5B, "presence of inductor" indicates I1, I2', I3, and ISO in the first arrangement example shown in FIG. 3A. In FIGS. 5A and 5B, "absence of inductor" indicates I1, I2', I3, and ISO when no connection unit 150 (no inductor 151) is provided. If no connection unit 150 (no inductor 151) is provided, ISO representing the isolation performance is −8.8 dB. On the other hand, if the connection unit 150 (inductor 151) is provided, ISO is improved to −43.1 dB.

When a film is formed on the substrate 112, a film can also be formed on the inner surface of the vacuum container 110. This changes the state of the inner surface of the vacuum container 110. If the isolation performance is low, the potential of the plasma formed in the internal space (the space between the first electrode 106 and the second electrode 111) of the vacuum container 110 is sensitive to the state of the inner surface of the vacuum container 110. On the other hand, if the isolation performance is high, the potential of the plasma formed in the internal space of the vacuum container 110 is insensitive to the state of the inner surface of the vacuum container 110. That is, if the isolation performance is high, it is possible to stabilize the plasma potential in long-term use of the plasma processing apparatus 1.

On the other hand, if the isolation performance is high, an electric field formed by a high frequency concentrates on the space between the first electrode 106 and the second electrode 111, and it may thus be difficult to ignite the plasma. The second, third, and fourth arrangement examples of the connection unit 150 to be described with reference to FIGS. 3B, 4A, and 4B take ignition of the plasma into consideration.

Figure 3B:
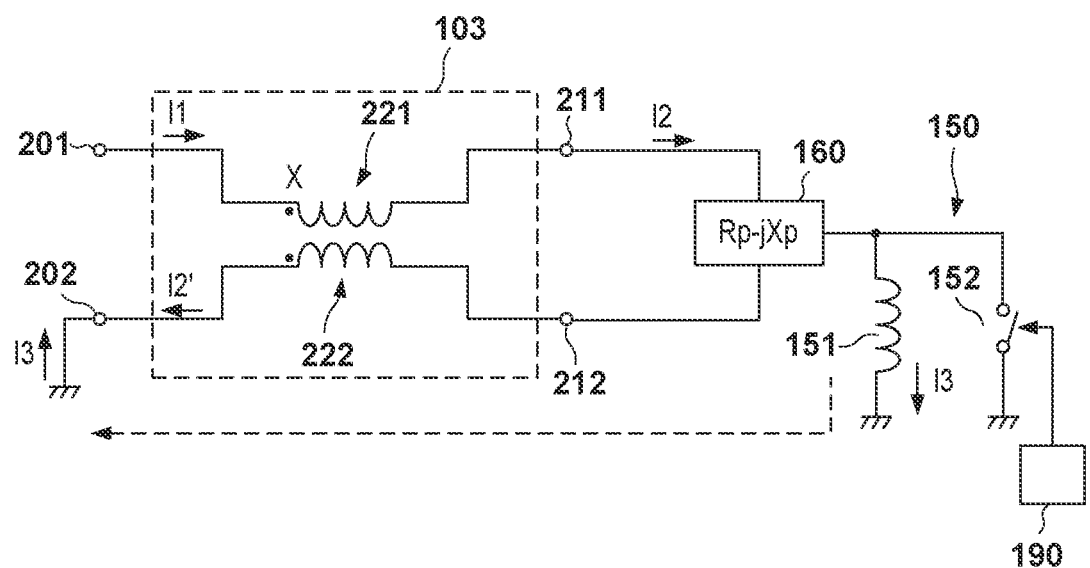
FIG. 3B is a circuit diagram for explaining the functions of the balun and the connection unit.

FIG. 3B shows the second arrangement example of the connection unit 150. The connection unit 150 in the second arrangement example includes an inductor 151 that electrically connects the vacuum container 110 (the conductor forming at least a portion of the vacuum container 110) and ground, and a switch 152 that can short-circuit the two terminals of the inductor 151. The switch 152 can be, for example, a relay. The plasma processing apparatus 1 may include a controller 190 that turns on the switch 152 at the time of igniting the plasma, and turns off the switch 152 after the plasma is ignited.

Figure 4A:
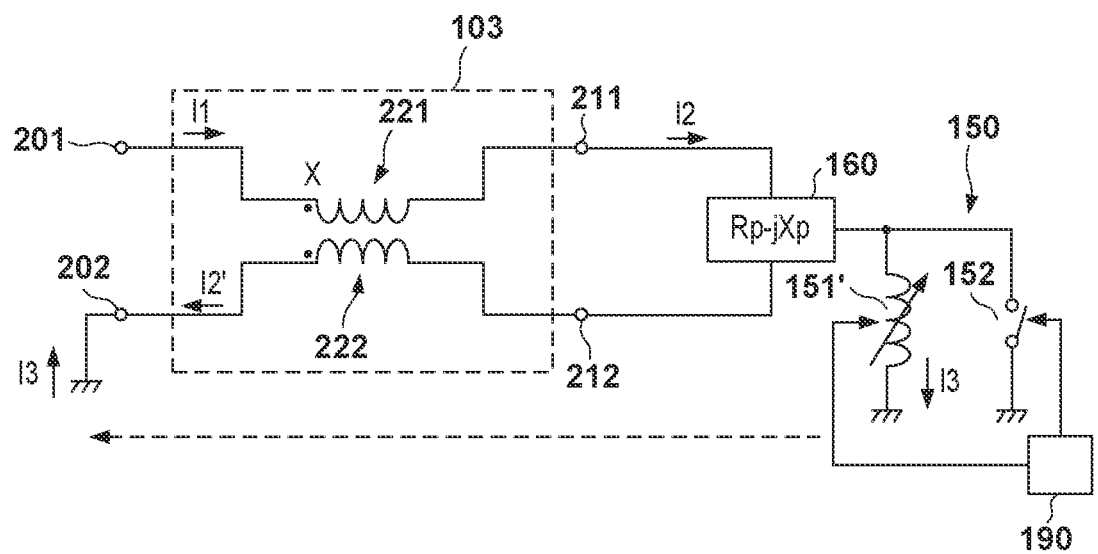
FIG. 4A is a circuit diagram for explaining the functions of the balun and the connection unit.

FIG. 4A shows the third arrangement example of the connection unit 150. The connection unit 150 in the third arrangement example includes an inductor 151' that electrically connects the vacuum container 110 (the conductor forming at least a portion of the vacuum container 110) and ground, and the switch 152 that can short-circuit the two terminals of the inductor 151'. The inductance of the inductor 151' is variable. The switch 152 can be, for example, a relay. The plasma processing apparatus 1 may include the controller 190 that turns on the switch 152 at the time of igniting the plasma, and turns off the switch 152 after the plasma is ignited. Furthermore, the controller 190 can control the state of the plasma by controlling the value of the inductance of the inductor 151'.

Figure 4B:
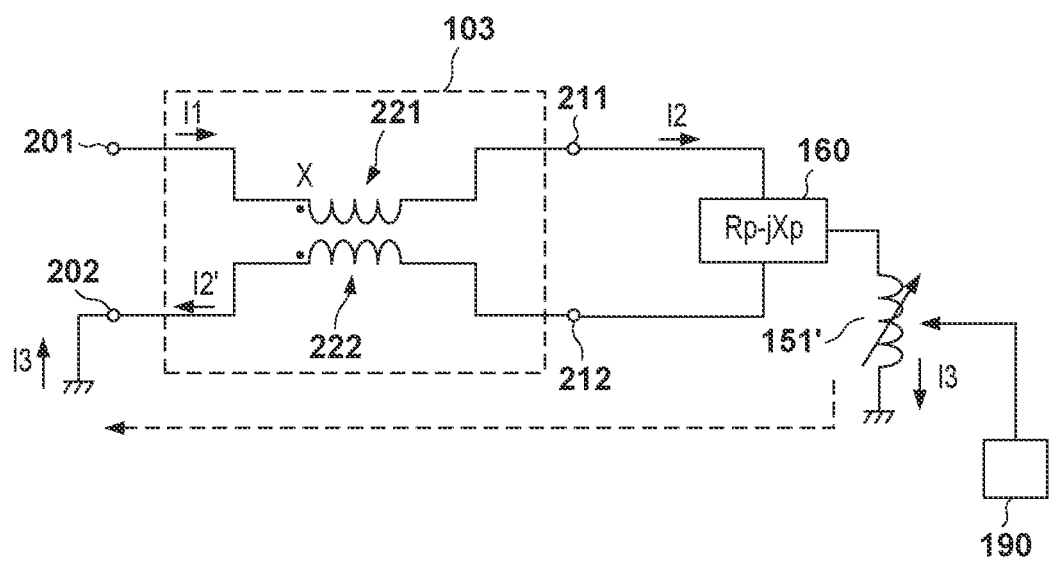
FIG. 4B is a circuit diagram for explaining the functions of the balun and the connection unit.

FIG. 4B shows the fourth arrangement example of the connection unit 150. The connection unit 150 in the fourth arrangement example includes the inductor 151' that connects the vacuum container 110 (the conductor forming at least a portion of the vacuum container 110) and ground. The inductance of the inductor 151' is variable. The plasma processing apparatus 1 can include the controller 190 that makes, after ignition of the plasma, the inductance of the inductor 151' larger than that before ignition of the plasma.

It is possible to obtain the same effect by providing a connection unit 155 that electrically connects the second input terminal 202 of the balun 103 and ground, instead of the connection unit 150 that electrically connects the vacuum container 110 (the conductor forming at least a portion of the vacuum container 110) and ground as described above. Furthermore, both the connection units 150 and 155 may be provided.

FIG. 5A shows the first arrangement example of the connection unit 155 that electrically connects the second input terminal 202 of the balun 103 and ground. The connection unit 155 includes an inductor 156.

It is possible to obtain high isolation performance by providing the first connection unit 155. On the other hand, as described above, if the isolation performance is high, an electric field formed by a high frequency concentrates on the space between the first electrode 106 and the second electrode 111, and it may thus be difficult to ignite the plasma. The second, third, and fourth arrangement examples of the connection unit 155 to be described with reference to FIGS. 5B, 6A, and 6B take ignition of the plasma into consideration.

FIG. 5B shows the second arrangement example of the connection unit 155. The connection unit 155 in the second arrangement example includes the inductor 156 that electrically connects the second input terminal 202 of the balun 103 and ground, and a switch 157 that can short-circuit the two terminals of the inductor 156. The switch 157 can be, for example, a relay. The plasma processing apparatus 1 may include the controller 190 that turns on the switch 157 at the time of igniting the plasma, and turns off the switch 157 after the plasma is ignited.

Figure 6A:
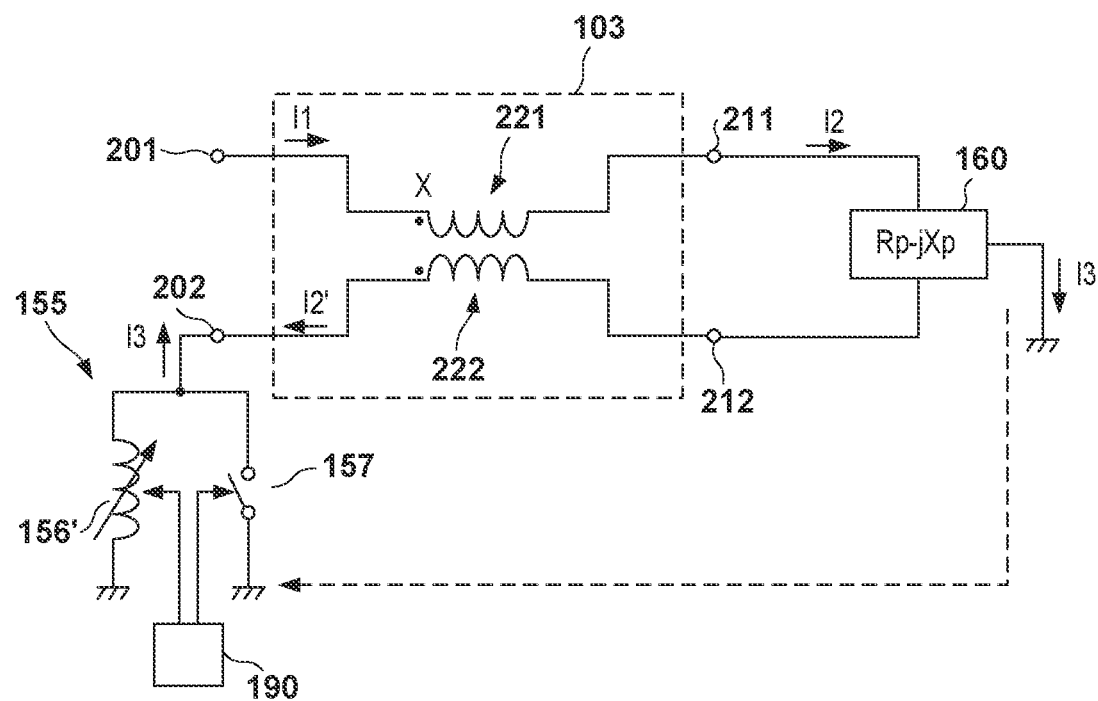
FIG. 6A is a circuit diagram for explaining the functions of the balun and the connection unit.

FIG. 6A shows the third arrangement example of the connection unit 155. The connection unit 155 in the third arrangement example includes an inductor 156' that connects the second input terminal 202 of the balun 103 and ground, and the switch 157 that can short-circuit the two terminals of the inductor 156'. The inductance of the inductor 156' is variable. The switch 157 can be, for example, a relay. The plasma processing apparatus 1 may include the controller 190 that turns on the switch 157 at the time of igniting the plasma, and turns off the switch 157 after the plasma is ignited. Furthermore, the controller 190 can control the state of the plasma by controlling the value of the inductance of the inductor 156'.

Figure 6B:
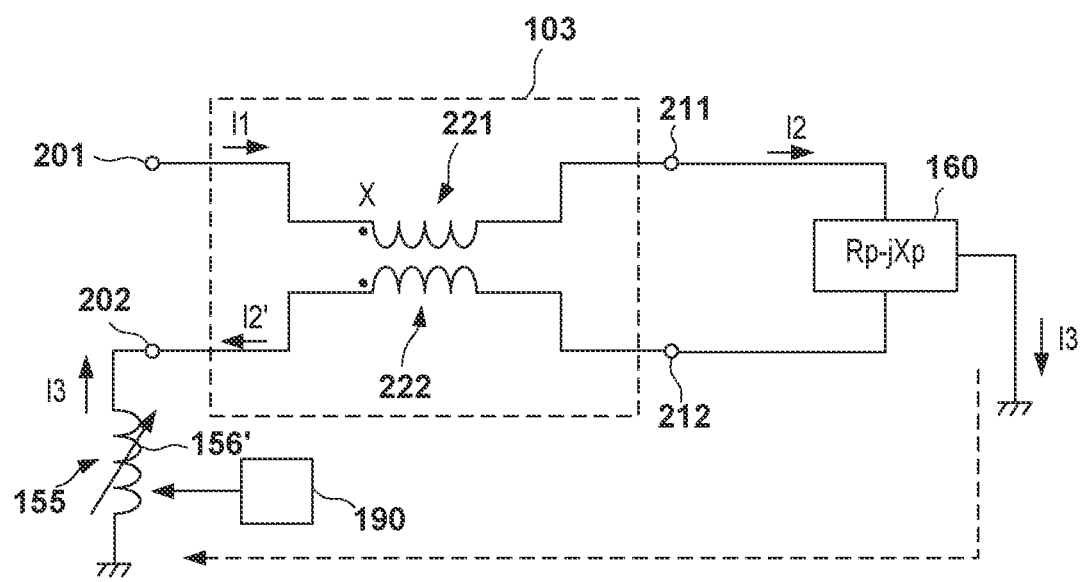
FIG. 6B is a circuit diagram for explaining the functions of the balun and the connection unit.

FIG. 6B shows the fourth arrangement example of the connection unit 155. The connection unit 155 in the fourth arrangement example includes the inductor 156' that connects the vacuum container 110 (the conductor forming at least a portion of the vacuum container 110) and ground. The inductance of the inductor 156' is variable. The plasma processing apparatus 1 can include the controller 190 that makes, after ignition of the plasma, the inductance of the inductor 156' larger than that before ignition of the plasma.

Figure 8:
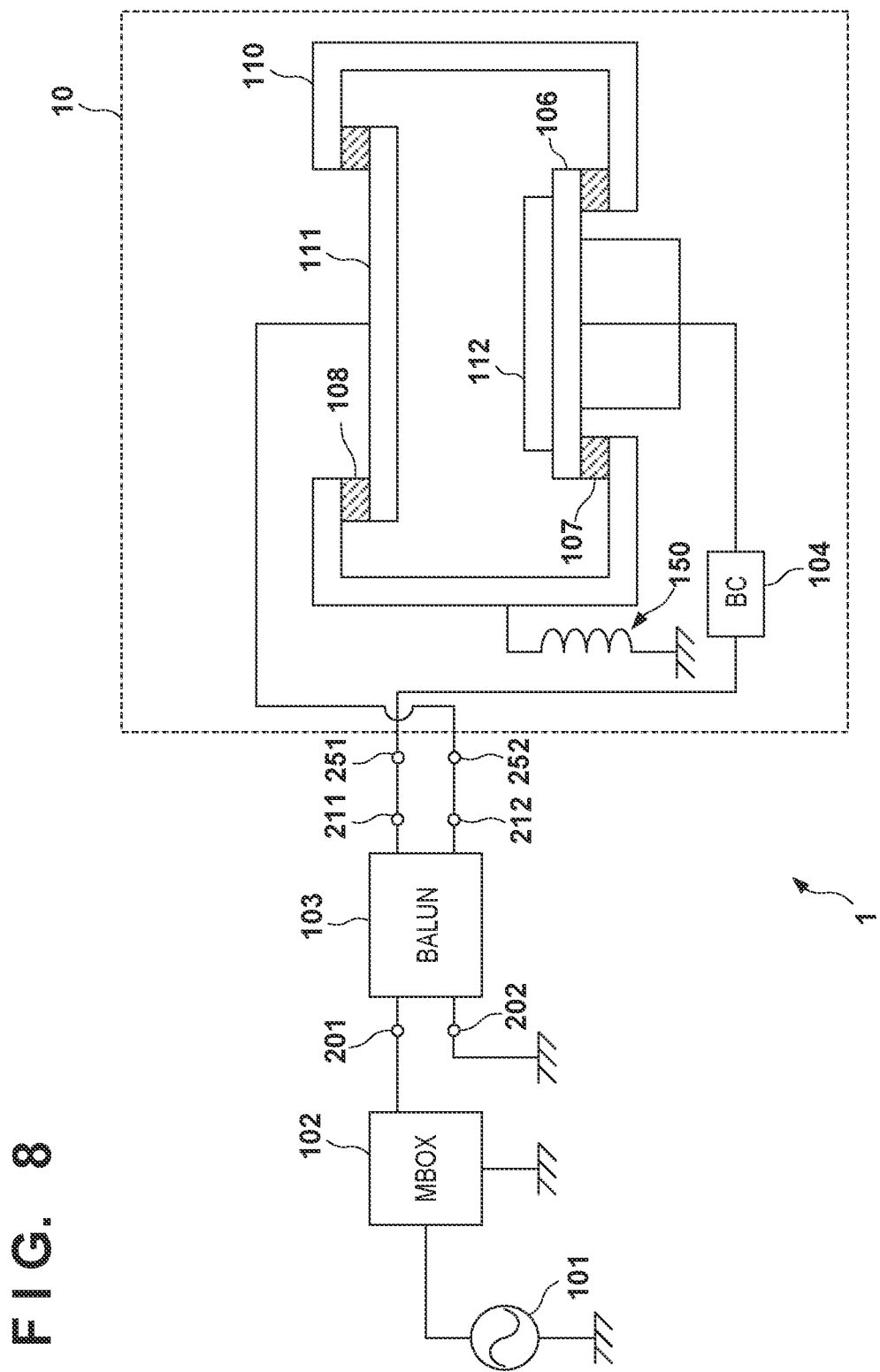
FIG. 8 is a circuit diagram schematically showing the arrangement of a plasma processing apparatus according to the second embodiment of the present invention.

FIG. 8 schematically shows the arrangement of a plasma processing apparatus 1 according to the second embodiment of the present invention. The plasma processing apparatus 1 according to the second embodiment can operate as an etching apparatus that etches a substrate 112. Items which are not referred to as the second embodiment can comply with the first embodiment. In the second embodiment, a first electrode 106 serves as a cathode, and holds the substrate 112. In the second embodiment, a second electrode 111 serves as an anode. In the plasma processing apparatus 1 according to the second embodiment, the first electrode 106 and a first output terminal 211 are electrically connected via a blocking capacitor 104. In the second embodiment as well, there is provided a connection unit 150 that electrically connects a vacuum container 110 (a conductor forming at least a portion of the vacuum container 110) and ground. The connection unit 150 can have, for example, one of the first to fourth arrangement examples of the connection unit 150.

Figure 9:
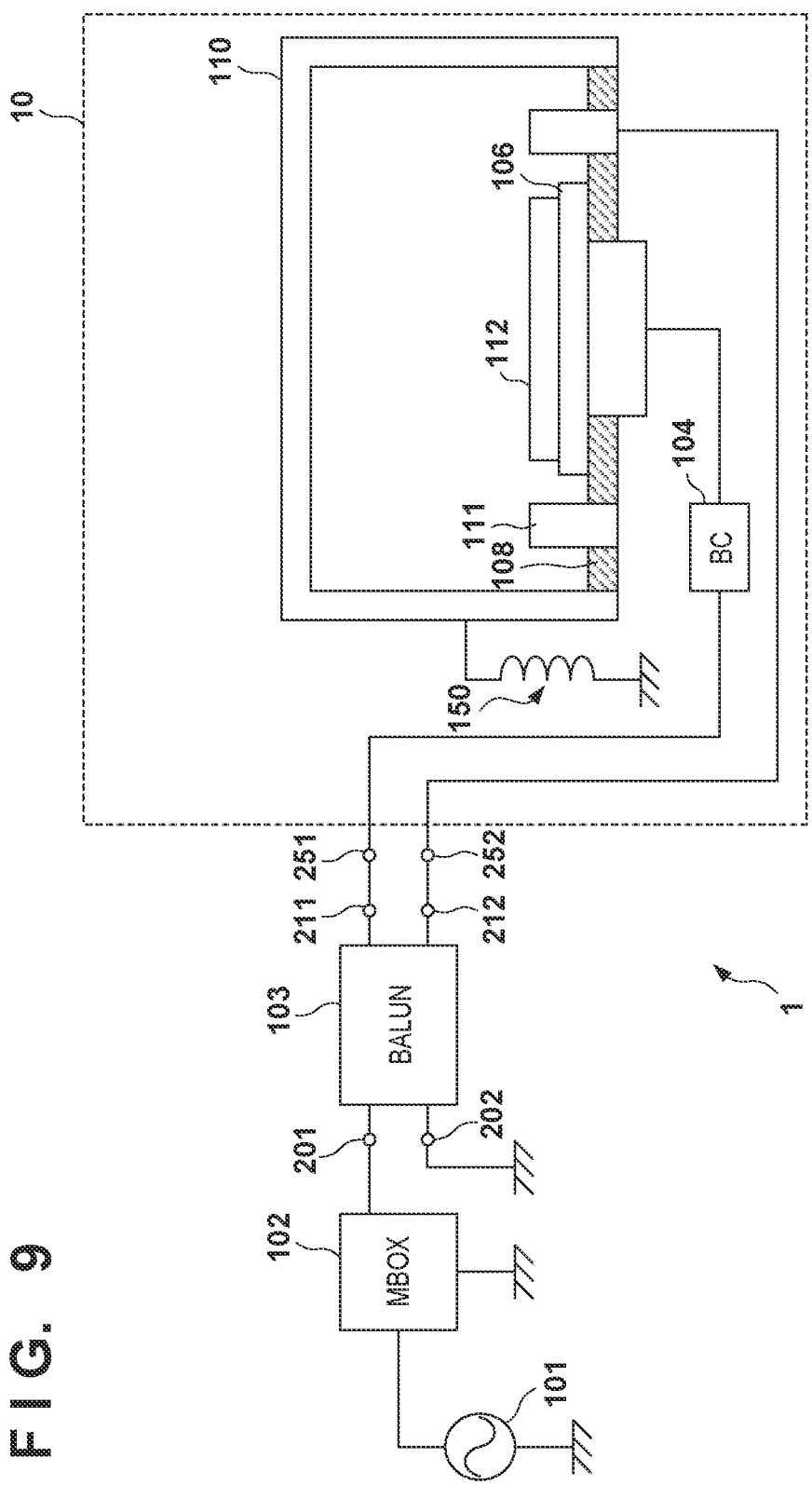
FIG. 9 is a circuit diagram schematically showing the arrangement of a plasma processing apparatus according to the third embodiment of the present invention.

FIG. 9 schematically shows the arrangement of a plasma processing apparatus 1 according to the third embodiment of the present invention. Items which are not referred to as the third embodiment can comply with the first embodiment. The plasma processing apparatus according to the first embodiment can operate as an etching apparatus that etches a substrate 112. A second electrode 111 can be arranged to surround the entire circumference of a first electrode 106. The second electrode 111 can have, for example, a tubular shape. The first electrode 106 and the second electrode 111 desirably have a coaxial structure. In one example, the first electrode 106 has a columnar shape centered on a virtual axis, and the second electrode 111 has a cylindrical shape centered on the virtual axis.

The above-described arrangement of the first electrode 106 and the second electrode 111 is advantageous in decreasing the impedance between the first electrode 106 and the second electrode 111. This is advantageous in decreasing a current flowing from the output side of a balun 103 to ground, that is, an in-phase current I3. Decreasing the in-phase current I3 means that a vacuum container 110 is made hard to function as an anode. Although the state of the inner wall of the vacuum container 110 can change along with etching of the substrate 112, a plasma potential can be made insensitive to the state of the inner wall of the vacuum container 110 by making the vacuum container 110 hard to function as an anode. This is advantageous in stabilizing the plasma potential in long-term use of the plasma processing apparatus 1. From another viewpoint, the impedance between the first electrode 106 and the second electrode 111 is preferably lower than that between the first electrode 106 and the vacuum container 110. This is advantageous in decreasing the in-phase current I3.

The distance (the size of the gap) between the first electrode 106 and the second electrode 111 is preferably equal to or shorter than the Debye length. This is effective for suppressing entering of plasma into the gap between the first electrode 106 and the second electrode 111.

The third embodiment has explained the plasma processing apparatus 1 that operates as an etching apparatus. However, the plasma processing apparatus 1 may be configured to operate as a sputtering apparatus that holds a target by the first electrode 106, holds the substrate by an additionally provided substrate holding unit, and forms a film on the substrate by sputtering the target.

Figure 10:
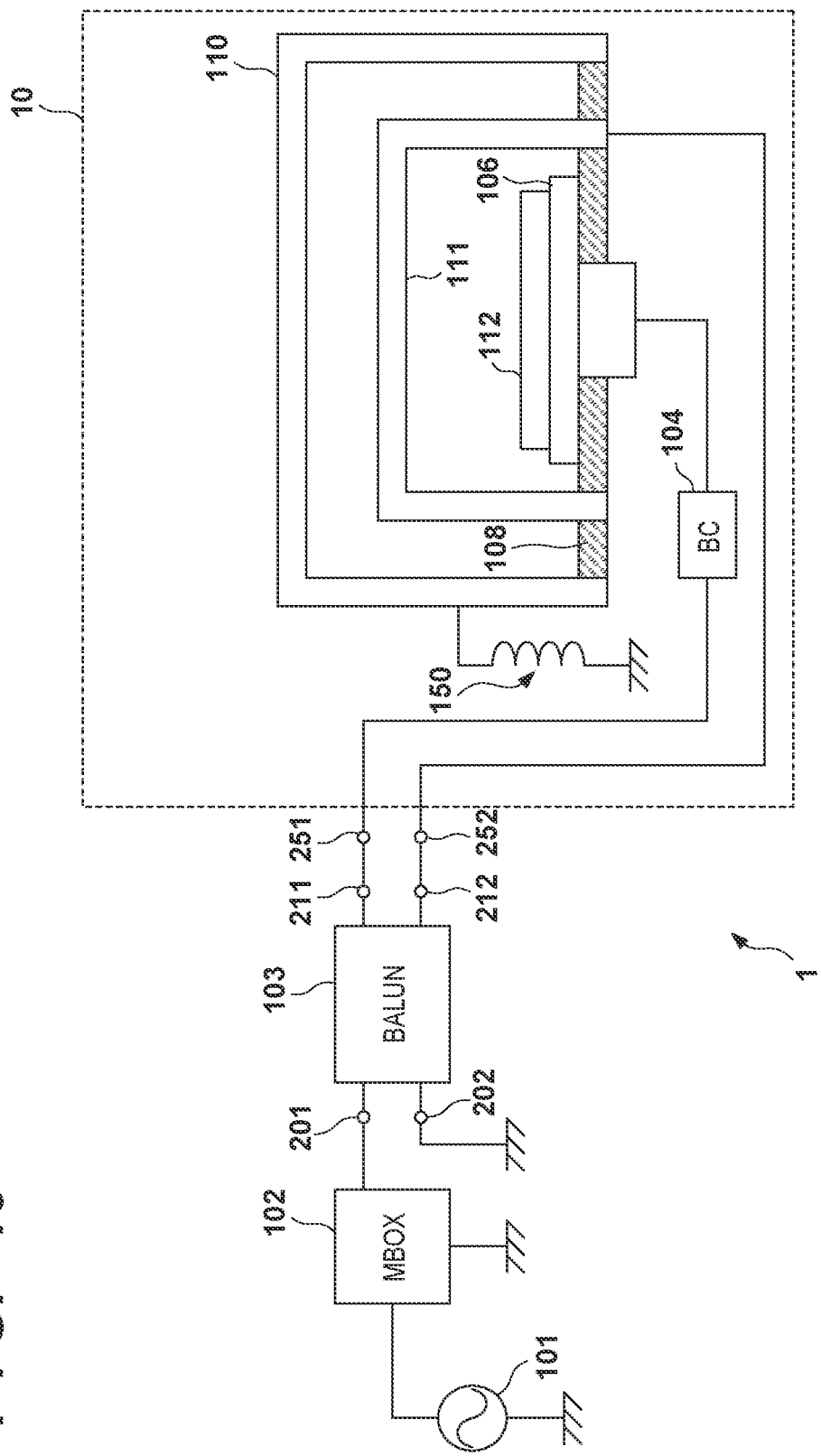
FIG. 10 is a circuit diagram schematically showing the arrangement of a plasma processing apparatus according to the fourth embodiment of the present invention.

FIG. 10 schematically shows the arrangement of a plasma processing apparatus 1 according to the fourth embodiment of the present invention. The plasma processing apparatus 1 according to the fourth embodiment is a modification of the third embodiment. In the fourth embodiment, a second electrode 111 includes portions opposing the upper and side surfaces of a first electrode 106, and is arranged to surround the upper and side surfaces of the first electrode 106. The portion (to be referred to as a side portion hereinafter) of the second electrode 111, which opposes the side surface of the first electrode 106, can have a shape that surrounds the entire circumference of the first electrode 106, for example, a tubular shape. The side portions of the first electrode 106 and the second electrode 111 desirably have a coaxial structure. In one example, the first electrode 106 has a columnar shape centered on a virtual axis, and the side portion of the second electrode 111 has a cylindrical shape centered on the virtual axis.

Figure 11:
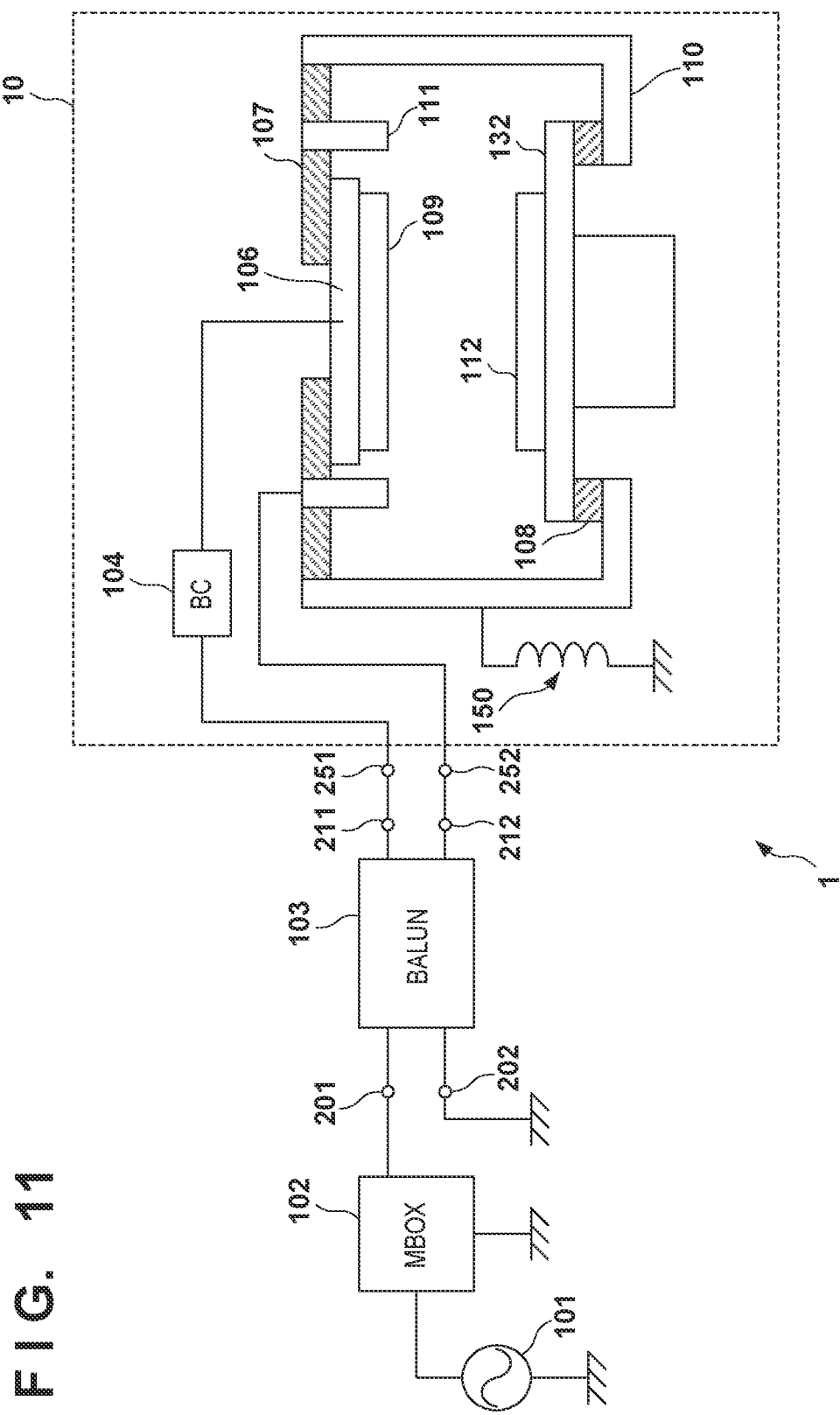
FIG. 11 is a circuit diagram schematically showing the arrangement of a plasma processing apparatus according to the fifth embodiment of the present invention.

FIG. 11 schematically shows the arrangement of a plasma processing apparatus 1 according to the fifth embodiment of the present invention. The plasma processing apparatus according to the fifth embodiment can operate as a sputtering apparatus that forms a film on a substrate 112 by sputtering. Items which are not referred to as the fifth embodiment can comply with the first embodiment.

The plasma processing apparatus 1 includes a balun 103, a vacuum container 110, a first electrode 106, a second electrode 111, a substrate holding unit 132, and a connection unit 150. Alternatively, it may be understood that the plasma processing apparatus 1 includes the balun 103 and a main body 10, and the main body 10 includes the vacuum container 110, the first electrode 106, the second electrode 111, the substrate holding unit 132, and the connection unit 150. The main body 10 includes a first terminal 251 and a second terminal 252. The first electrode 106 may be arranged to separate a vacuum space and an external space (that is, to form part of a vacuum partition) in cooperation with the vacuum container 110, or may be arranged in the vacuum container 110. The second electrode 111 may be arranged to separate a vacuum space and an external space (that is, to form part of a vacuum partition) in cooperation with the vacuum container 110, or may be arranged in the vacuum container 110.

The first electrode 106 and the second electrode 111 are arranged to oppose a space on the side of the substrate holding unit 132 (the substrate 112 held by the substrate holding unit 132). The second electrode 111 can be arranged to surround the entire circumference of the first electrode 106. The second electrode 111 can have, for example, a tubular shape. The first electrode 106 and the second electrode 111 desirably have a coaxial structure. In one example, the first electrode 106 has a columnar shape centered on a virtual axis, and the second electrode 111 has a cylindrical shape centered on the virtual axis.

The above-described arrangement of the first electrode 106 and the second electrode 111 is advantageous in decreasing the impedance between the first electrode 106 and the second electrode 111. This is advantageous in decreasing a current flowing from the output side of the balun 103 to ground, that is, an in-phase current I3. Decreasing the in-phase current I3 means that the vacuum container 110 is made hard to function as an anode. Although an unintended film can be formed on the inner wall of the vacuum container 110 along with formation of a film on the substrate 112, a plasma potential can be made insensitive to the state of the inner wall of the vacuum container 110 by making the vacuum container 110 hard to function as an anode. This is advantageous in stabilizing the plasma potential in long-term use of the plasma processing apparatus 1. From another viewpoint, the impedance between the first electrode 106 and the second electrode 111 is preferably smaller than that between the first electrode 106 and the vacuum container 110. This is advantageous in decreasing the in-phase current.

The distance (the size of the gap) between the first electrode 106 and the second electrode 111 is preferably equal to or shorter than the Debye length. This is effective for suppressing entering of plasma into the gap between the first electrode 106 and the second electrode 111.

Figure 12:
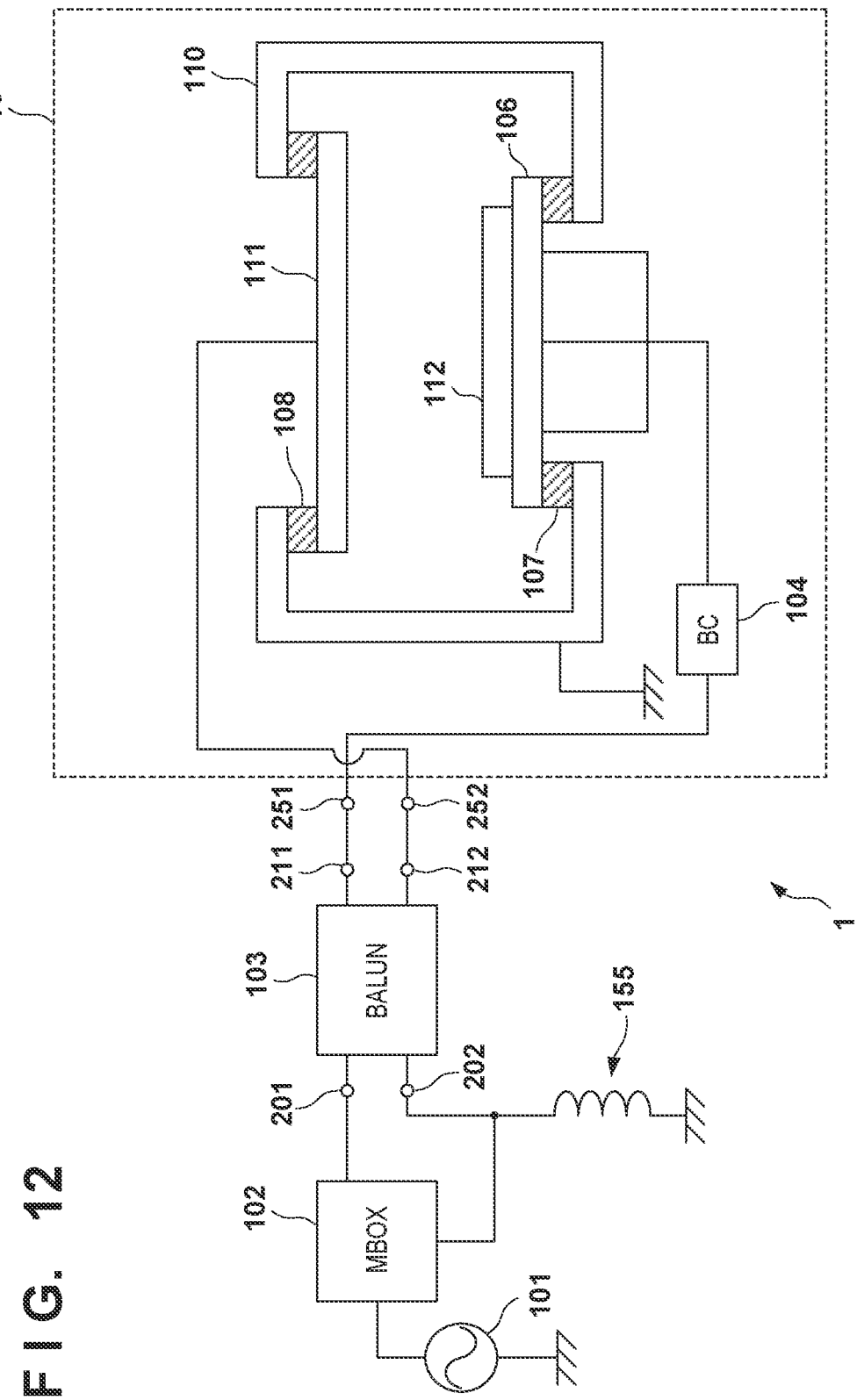
FIG. 12 is a circuit diagram schematically showing the arrangement of a plasma processing apparatus according to the sixth embodiment of the present invention.

FIG. 12 schematically shows the arrangement of a plasma processing apparatus 1 according to the sixth embodiment of the present invention. The plasma processing apparatus 1 according to the sixth embodiment can operate as an etching apparatus that etches a substrate 112. Items which are not referred to as the sixth embodiment can comply with the second embodiment. In the sixth embodiment, there is provided a connection unit 155 that electrically connects a second input terminal 202 of a balun 103 and ground. The connection unit 155 can have, for example, one of the first to fourth arrangement examples of the connection unit 155.

Figure 13:
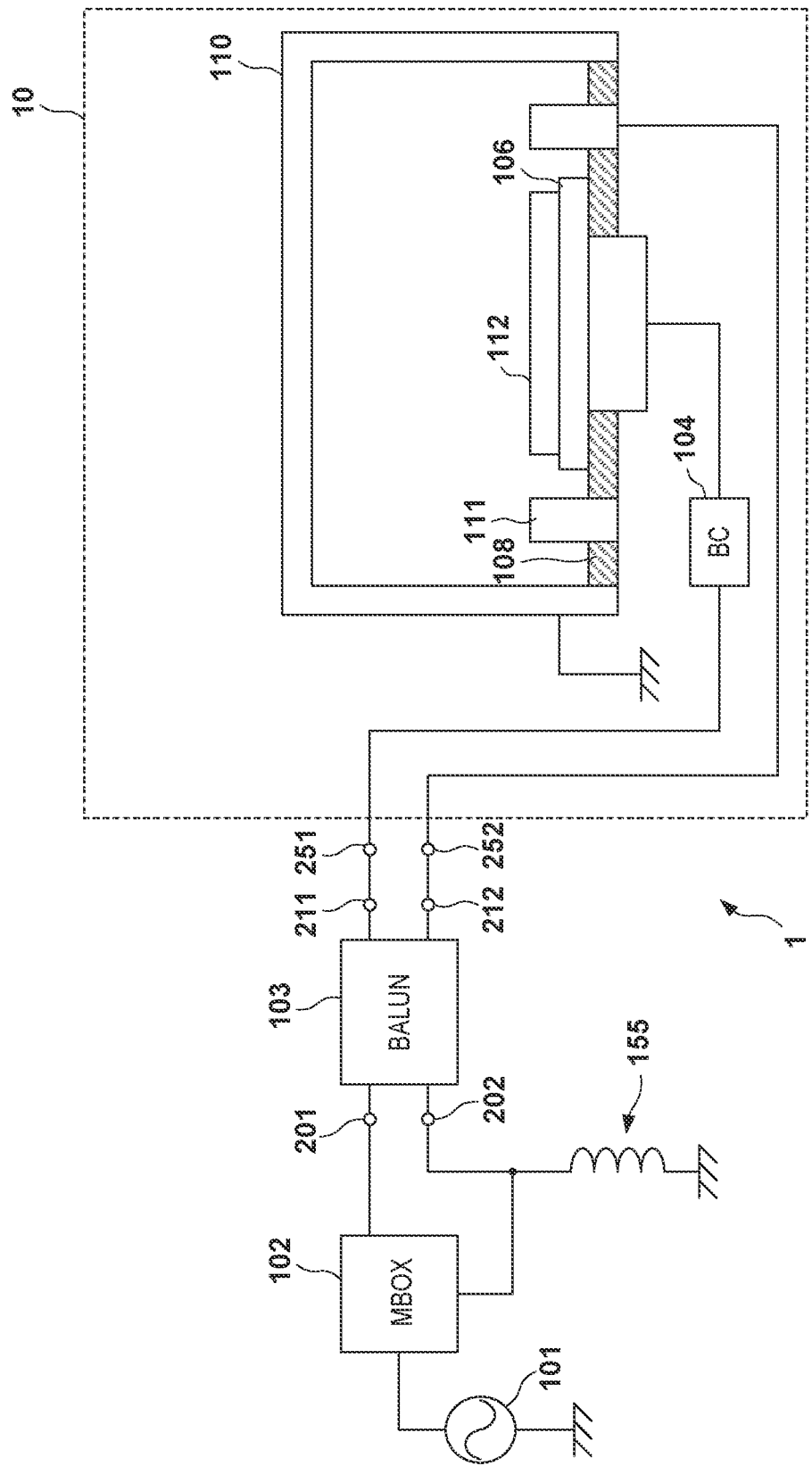
FIG. 13 is a circuit diagram schematically showing the arrangement of a plasma processing apparatus according to the seventh embodiment of the present invention.

FIG. 13 schematically shows the arrangement of a plasma processing apparatus 1 according to the seventh embodiment of the present invention. Items which are not referred to as the seventh embodiment can comply with the third embodiment. The plasma processing apparatus according to the seventh embodiment can operate as an etching apparatus that etches a substrate 112. In the seventh embodiment as well, there is provided a connection unit 155 that electrically connects a second input terminal 202 of a balun 103 and ground. The connection unit 155 can have, for example, one of the first to fourth arrangement examples of the connection unit 155.

Figure 14:
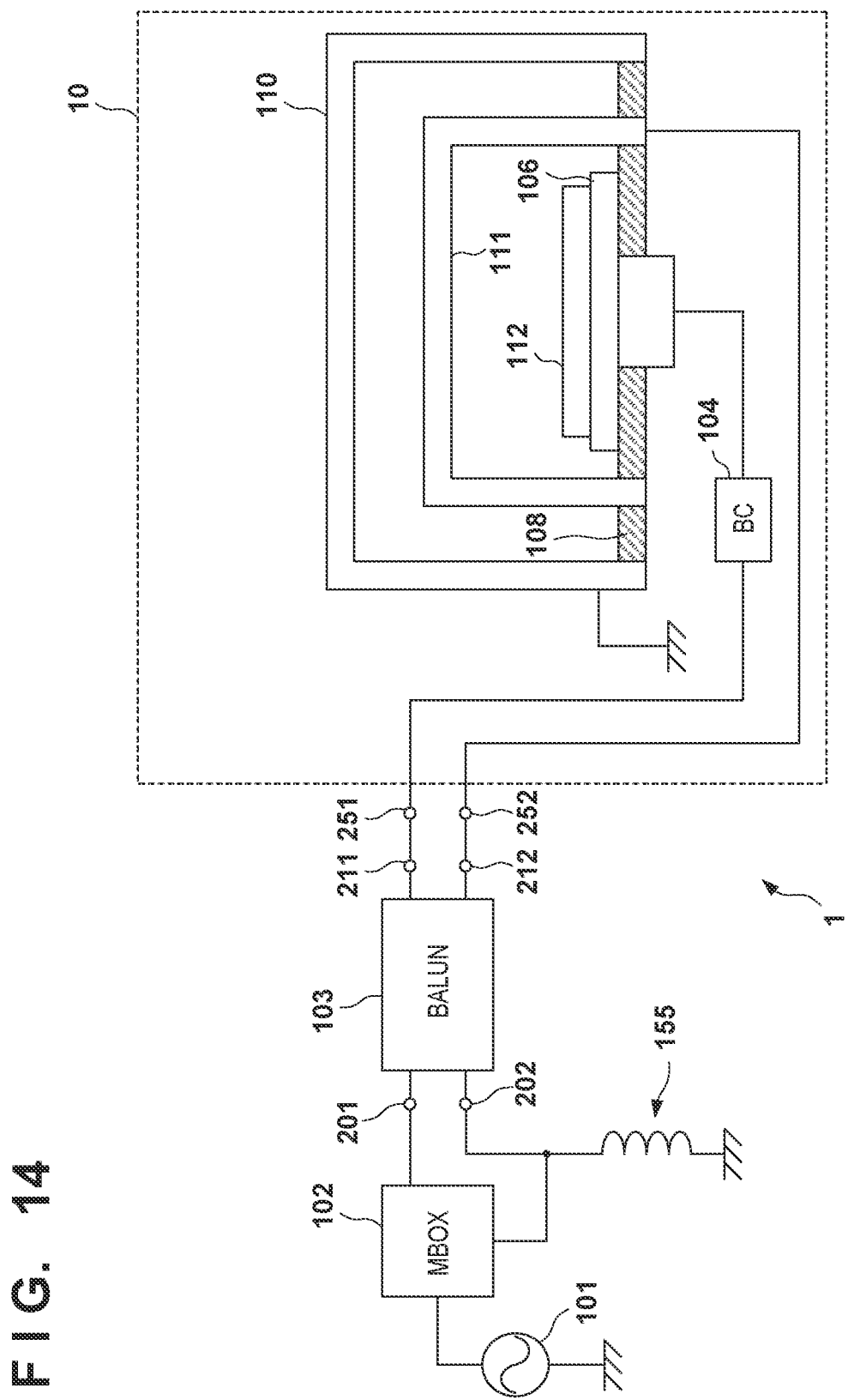
FIG. 14 is a circuit diagram schematically showing the arrangement of a plasma processing apparatus according to the eighth embodiment of the present invention.

FIG. 14 schematically shows the arrangement of a plasma processing apparatus 1 according to the eighth embodiment of the present invention. Items which are not referred to as the eighth embodiment can comply with the fourth embodiment. In the eighth embodiment as well, there is provided a connection unit 155 that electrically connects a second input terminal 202 of a balun 103 and ground. The connection unit 155 can have, for example, one of the first to fourth arrangement examples of the connection unit 155.

Figure 15:
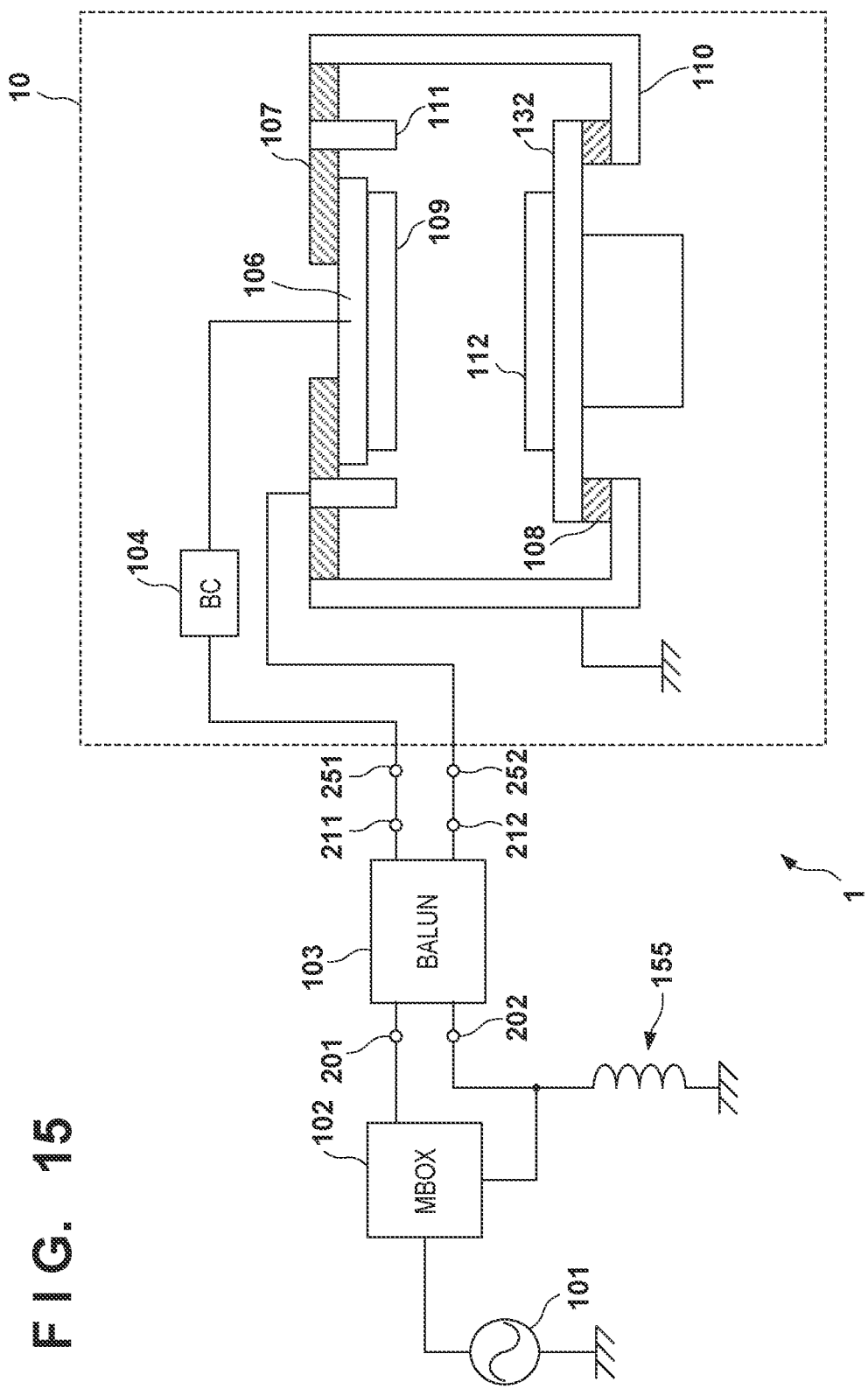
FIG. 15 is a circuit diagram schematically showing the arrangement of a plasma processing apparatus according to the ninth embodiment of the present invention.

FIG. 15 schematically shows the arrangement of a plasma processing apparatus 1 according to the ninth embodiment of the present invention. The plasma processing apparatus according to the ninth embodiment can operate as a sputtering apparatus that forms a film on a substrate 112 by sputtering. Items which are not referred to as the ninth embodiment can comply with the fifth embodiment. In the ninth embodiment as well, there is provided a connection unit 155 that electrically connects a second input terminal 202 of a balun 103 and ground. The connection unit 155 can have, for example, one of the first to fourth arrangement examples of the connection unit 155.

Each of the above-described connection units 150 and 155 can be understood as a connection unit that connects the vacuum container 110 and the second input terminal 202 of the balun 103. In the arrangement in which the vacuum container 110 and the second input terminal 202 of the balun 103 are connected by the connection unit 150 or 155, one of the vacuum container 110 and the second input terminal 202 of the balun 103 can be grounded.

REFERENCE SIGNS LIST

1: plasma processing apparatus, 10: main body, 101: high-frequency power supply, 102: impedance matching circuit, 103: balun, 104: blocking capacitor, 106: first electrode, 107, 108: insulator, 109: target, 110: vacuum container, 111: second electrode, 112: substrate, 150: connection unit, 151: inductor, 151': inductor, 152: switch, 155: connection unit, 156: inductor, 156': inductor, 157: switch, 190: controller, 201: first input terminal, 202: second input terminal, 211: first output terminal, 212: second output terminal, 251: first terminal, 252: second terminal, 221: first coil, 222: second coil, 223: third coil, 224: fourth coil

The invention claimed is:

1. A plasma processing apparatus comprising:
 a balun including a first input terminal, a second input terminal, a first output terminal, and a second output terminal;
 a vacuum container;
 a first electrode electrically connected to the first output terminal;
 a second electrode electrically connected to the second output terminal;
 a connection unit configured to electrically connect the vacuum container and ground, the connection unit including an inductor;
 a high-frequency power supply; and
 an impedance matching circuit arranged between the high-frequency power supply and the balun.

2. A plasma processing apparatus comprising:
 a balun including a first input terminal, a second input terminal, a first output terminal, and a second output terminal;
 a grounded vacuum container;
 a first electrode electrically connected to the first output terminal;
 a second electrode electrically connected to the second output terminal;
 a connection unit configured to electrically connect the second input terminal and ground, the connection unit including an inductor;
 a high-frequency power supply; and
 an impedance matching circuit arranged between the high-frequency power supply and the balun.

3. A plasma processing apparatus comprising:
 a balun including a first input terminal, a second input terminal, a first output terminal, and a second output terminal;
 a vacuum container;
 a first electrode electrically connected to the first output terminal;
 a second electrode electrically connected to the second output terminal; and
 a connection unit configured to electrically connect the vacuum container and the second input terminal, the connection unit including an inductor;
 a high-frequency power supply; and
 an impedance matching circuit arranged between the high-frequency power supply and the balun.

4. The plasma processing apparatus according to claim 3, wherein the connection unit further includes a switch configured to short-circuit two terminals of the inductor.

5. The plasma processing apparatus according to claim 4, wherein the switch includes a relay.

6. The plasma processing apparatus according to claim 5, further comprising a controller configured to turn on the switch at the time of igniting plasma, and to turn off the switch after the plasma is ignited.

7. The plasma processing apparatus according to claim 3, wherein an inductance of the inductor is variable.

8. The plasma processing apparatus according to claim 3, wherein
 an inductance of the inductor is variable, and
 the plasma processing apparatus further includes a controller configured to make, after ignition of plasma, the inductance larger than the inductance before the ignition of the plasma.

9. The plasma processing apparatus according to claim 3, wherein the second electrode is arranged to surround an entire circumference of the first electrode.

10. The plasma processing apparatus according to claim 9, wherein the second electrode has a tubular shape.

11. The plasma processing apparatus according to claim 10, wherein the first electrode and the second electrode are arranged to form a coaxial structure.

12. The plasma processing apparatus according to claim 3, wherein the second electrode includes a portion opposing an upper surface and a side surface of the first electrode, and is arranged to surround the upper surface and the side surface of the first electrode.

13. The plasma processing apparatus according to claim 3, wherein the first electrode serves as a cathode, and the second electrode serves as an anode.

14. The plasma processing apparatus according to claim 3, wherein the first output terminal and the first electrode are electrically connected via a blocking capacitor.

15. The plasma processing apparatus according to claim 3, wherein the plasma processing apparatus is configured as an etching apparatus.

16. The plasma processing apparatus according to claim 3, wherein the plasma processing apparatus is configured as a sputtering apparatus.

* * * * *